(12) United States Patent
Fujinaga et al.

(10) Patent No.: US 10,370,757 B2
(45) Date of Patent: Aug. 6, 2019

(54) THIN SUBSTRATE PROCESSING DEVICE

(71) Applicant: ULVAC, Inc., Chigasaki-shi (JP)

(72) Inventors: Tetsushi Fujinaga, Chigasaki (JP);
Masahiro Matsumoto, Chigasaki (JP);
Makoto Arai, Chigasaki (JP); Eriko Mase, Chigasaki (JP); Harunori Iwai, Chigasaki (JP); Koji Takahashi, Chigasaki (JP); Atsuhito Ihori, Chigasaki (JP)

(73) Assignee: ULVAC, INC., Chigasaki-shi (JP)

( * ) Notice: Subject to any disclaimer, the term of this patent is extended or adjusted under 35 U.S.C. 154(b) by 734 days.

(21) Appl. No.: 14/648,226

(22) PCT Filed: Jan. 28, 2014

(86) PCT No.: PCT/JP2014/051856
§ 371 (c)(1),
(2) Date: Sep. 8, 2016

(87) PCT Pub. No.: WO2014/119580
PCT Pub. Date: Aug. 7, 2014

(65) Prior Publication Data
US 2016/0376697 A1 Dec. 29, 2016

(30) Foreign Application Priority Data

Feb. 4, 2013 (JP) ................................. 2013-019767
Feb. 4, 2013 (JP) ................................. 2013-019768

(51) Int. Cl.
*H01J 37/34* (2006.01)
*C23C 14/54* (2006.01)
(Continued)

(52) U.S. Cl.
CPC .......... *C23C 14/541* (2013.01); *C23C 14/345* (2013.01); *C23C 14/50* (2013.01);
(Continued)

(58) Field of Classification Search
CPC ............. H01J 37/3411; H01J 37/32715; H01J 37/32724; H01J 37/34; H01J 37/3464;
(Continued)

(56) References Cited

U.S. PATENT DOCUMENTS 4,747,928 A * 5/1988 Takahashi ............. C23C 14/541
118/500
6,093,654 A 7/2000 Koyama
(Continued)

FOREIGN PATENT DOCUMENTS

CN 1914714 A 2/2007
CN 100505155 C 6/2009
(Continued)

OTHER PUBLICATIONS

"Chinese Application Serial No. 201480003237.3, Office Action dated Jun. 1, 2016", (w/ English Translation), 16 pgs.
(Continued)

*Primary Examiner* — Rodney G McDonald
(74) *Attorney, Agent, or Firm* — Schwegman Lundberg & Woessner, P.A.

(57) ABSTRACT

A thin substrate processing device include a substrate processing unit configured to process a thin substrate, and a cooling unit configured to cool the thin substrate when the substrate processing unit is processing the thin substrate.

11 Claims, 10 Drawing Sheets

(51) Int. Cl.
*C23C 14/50* (2006.01)
*H01L 21/67* (2006.01)
*H01L 21/683* (2006.01)
*C23C 14/56* (2006.01)
*C23C 14/34* (2006.01)
*H01J 37/32* (2006.01)

(52) U.S. Cl.
CPC ...... *C23C 14/568* (2013.01); *H01J 37/32009* (2013.01); *H01J 37/3244* (2013.01); *H01J 37/32697* (2013.01); *H01J 37/32715* (2013.01); *H01J 37/32724* (2013.01); *H01J 37/34* (2013.01); *H01J 37/3464* (2013.01); *H01J 37/3497* (2013.01); *H01L 21/67109* (2013.01); *H01L 21/6838* (2013.01)

(58) Field of Classification Search
CPC .... H01J 37/3497; C23C 14/50; C23C 14/541; C23C 14/345; C23C 14/568; H01L 21/67109; H01L 21/6838
USPC .......... 204/192.13, 192.17, 298.25; 118/500, 118/719
See application file for complete search history.

(56) References Cited

U.S. PATENT DOCUMENTS

| | | | |
|---|---|---|---|
| 6,171,641 B1* | 1/2001 | Okamoto | C23C 16/463 204/192.13 |
| 8,390,980 B2 | 3/2013 | Sansoni et al. | |
| 8,776,542 B2 | 7/2014 | Endo et al. | |
| 2005/0263390 A1* | 12/2005 | Gung | C23C 14/046 204/192.17 |
| 2007/0178698 A1 | 8/2007 | Okita et al. | |
| 2010/0039747 A1 | 2/2010 | Sansoni et al. | |
| 2011/0155569 A1 | 6/2011 | Endo et al. | |
| 2012/0231553 A1 | 9/2012 | Okita et al. | |

FOREIGN PATENT DOCUMENTS

| | | |
|---|---|---|
| CN | 101492807 A | 7/2009 |
| JP | 58-32410 A | 2/1983 |
| JP | 59-141569 U | 9/1984 |
| JP | 62-035517 A | 2/1987 |
| JP | 62-193141 A | 8/1987 |
| JP | 09-199488 A | 7/1997 |
| JP | 10-064908 A | 3/1998 |
| JP | 11-238596 A | 8/1999 |
| JP | 2003-197811 A | 7/2003 |
| JP | 2006-028562 A | 2/2006 |
| JP | 2011-149100 A | 8/2011 |
| JP | 2011-530833 A | 12/2011 |
| WO | WO-2012/113792 A1 | 8/2012 |

OTHER PUBLICATIONS

"Taiwanese Application Serial No. 10420584360, Office Action dated May 3, 2015", (w/ English Translation), 6 pgs.
"Korean Application Serial No. 10-2015-7016882, Notice dated Dec. 14, 2016", (w/ English !Translation), 10 pgs.
"International Application No. PCT/JP2014/051856, International Preliminary Report on Patentability dated Aug. 4, 2015", 10 pgs.
"International Application No. PCT JP2014/051856, Written Opinion dated Apr. 22, 2014", 9 pgs.
International Application No. PCT/JP2014/051856, International Search Report dated Apr. 22, 2014, 4 pgs.

\* cited by examiner

Load-Unload Direction

Transportation Direction

Upright Direction

Transportation Direction

Load-Unload Direction

Transportation Direction

10,370,757 B2

THIN SUBSTRATE PROCESSING DEVICE

CLAIM OF PRIORITY

This application is a U.S. National Stage Filing under 35 U.S.C. 371 from International Application No. PCT/JP2014/051856, filed on Jan. 28, 2014, and published as WO 2014/119580 A1 on Aug. 7, 2014, and claims the benefit of priority under 35 U.S.C. § 119 to Japanese Patent Application No. 2013-019768, filed on Feb. 4, 2013, and to Japanese Patent Application No. 2013-019767, filed on Feb. 4, 2013 which are hereby incorporated by reference herein in their entireties.

TECHNICAL FIELD

The technique of the present disclosure relates to a thin substrate processing device that processes a thin substrate such as a printed circuit board and a film substrate.

BACKGROUND ART

To mount electronic components onto a mounting substrate, the mounting substrate includes an adhesion layer, serving as an underlying layer for wires connected to the electronic components, and a seed layer, used to form the wires. To form each layer, plating or sputtering is performed (see Patent Document 1, for example).
Patent Document 1: Japanese Laid-Open Patent Publication No. 2003-197811

SUMMARY OF THE INVENTION

Due to the further integration of wires over these recent years, sputtering rather than plating has been studied for the formation of the seed layer. Further, to reduce the weight and thickness of the electronic devices, the use of a thin mounting substrate and the use of a thin film substrate having a thickness of several tens of micrometers to several hundreds of micrometers have been studied. In a thin substrate such as a printed circuit board or a film substrate, the shape of the substrate changes at a lower temperature than a conventionally used glass substrate. Therefore, when the adhesion layer and the seed layer are formed through sputtering, high-energy sputtering grains reaching the thin substrate increase the temperature of the thin substrate and change the shape of the thin substrate. Such a problem occurs not only when forming the thin film on the thin substrate through sputtering but also when performing surface processing on the thin substrate, such as reverse sputtering, etching using a plasma, or ion bombardment using an ion gun.

It is an object of the technique of the present disclosure to provide a thin substrate processing device that limits increases in the temperature of the thin substrate.

One aspect of a thin substrate processing device according to the technique of the present disclosure includes a substrate processing unit configured to process a thin substrate, and a cooling unit configured to cool the thin substrate when the substrate processing unit is processing the thin substrate.

According to this configuration, even when a thin substrate processed by the substrate processing unit is heated, the rise in the temperature of the thin substrate can be limited because the cooling unit is cooling the thin substrate.

In a preferred aspect, the thin substrate processing device includes a transporting unit configured to transport the thin substrate between a processing position, at which the thin substrate is processed by the substrate processing unit, and a non-processing position, at which the thin substrate is not processed by substrate processing unit. A position changing unit is configured to change a position of the cooling unit relative to the thin substrate located at the processing position. The position changing unit is further configured to change the position of the cooling unit between a contact position at which the cooling unit contacts the thin substrate and a non-contact position at which the cooling unit does not contact the thin substrate. The transporting unit is configured to transport the thin substrate when the cooling unit is located at the non-contact position.

According to this configuration, transportation of the thin substrate when the thin substrate and the cooling unit are in contact with each other can be limited so that damaging of the thin substrate and the cooling unit can be limited.

In a preferred aspect, the transporting unit is further configured to transport the thin substrate between the processing position and the non-processing position while supporting a lower end of the thin substrate when the thin substrate is upright. The thin substrate processing device further includes a substrate fixing unit configured to fix the thin substrate at the processing position by holding an upper end of the thin substrate in an upright direction.

According to this configuration, because the thin substrate is held by the substrate fixing unit at the processing position, displacement of the thin substrate can be limited even when the cooling unit contacts the thin substrate.

In a preferred aspect, the substrate processing unit includes at least one of: a film formation processing unit configured to form a thin film on the thin substrate by sputtering a target; a reverse sputtering unit configured to perform reverse sputtering on the thin substrate by applying a bias voltage to the thin substrate; an ion processing unit configured to perform ion bombardment on the thin substrate; and an etching unit configured to perform an etching on the thin substrate by applying a bias voltage to the thin substrate while generating plasma with an induction coil.

According to this configuration, even when the thin substrate has been heated by a sputtering, reverse sputtering, ion bombardment, or etching, the thin substrate is cooled by the cooling unit. This limits rises in the temperature of the thin substrate.

In a preferred aspect, the substrate processing unit includes the film formation processing unit and the reverse sputtering unit that share a vacuum chamber. The target of the film formation processing unit is opposed to the thin substrate in the vacuum chamber. The thin substrate processing device further includes a shutter configured to cover a surface of the target when the reverse sputtering unit performs reverse sputtering on a surface of the thin substrate opposing the surface of the target.

According to this configuration, the thin substrate is reversely sputtered when the surface of the target is covered by the shutter. Therefore, even when a film formation processing unit and a reverse sputtering unit are set in the same vacuum chamber, adhesion of the grains discharged from the thin substrate by the cleaning (reverse sputtering) of the film substrate to the surface of the target can be limited. This reduces the grains released from the thin substrate that are included in the sputtering grains discharged from the target.

In a preferred aspect, the reverse sputtering unit includes a voltage application unit configured to apply a bias voltage to the thin substrate, and a gas supply unit configured to supply a gas to the thin substrate. The voltage application unit is configured to apply a bias voltage having a frequency that is higher than or equal to 1 MHz and lower than or equal to 6 MHz to the thin substrate supplied with the gas.

Alternatively, the voltage application unit is configured to apply a bias voltage having a frequency that is higher than or equal to 13 MHz and lower than or equal to 28 MHz and a bias voltage having a frequency that is higher than or equal to 100 kHz and lower than or equal to 1 MHz to the thin substrate supplied with the gas.

As a result of research into the conditions of performing reverse sputtering on the thin substrate, the inventors of the present application have found that when the frequency of the voltage applied to the thin substrate is higher than or equal to 1 MHz and lower than or equal to 6 MHz, the speed of reversely sputtering the thin substrate is increased as compared with the reverse sputtering speed when the frequency is higher than 6 MHz. Further, the inventors have found that even when the frequency of the voltage applied to the thin substrate is higher than or equal to 13 MHz and lower than or equal to 28 MHz, the speed for reversely sputtering the thin substrate is increased by superposing a voltage of a lower frequency, that is, a voltage of which a frequency is higher than or equal to 100 kHz and lower than or equal to 1 MHz.

In this regard, when the thin substrate is reversely sputtered, the speed of reversely sputtering the thin substrate is increased because the voltage applied to the thin substrate has a frequency higher than or equal to 1 MHz and lower than or equal to 6 MHz.

Further, when the thin substrate is reversely sputtered, the speed of reversely sputtering the thin substrate is also increased when the voltage of which a frequency is higher than or equal to 13 MHz and lower than or equal to 28 MHz and the voltage of which a frequency is higher than or equal to 100 kHz and lower than or equal to 1 MHz are superimposed to the thin substrate.

In a preferred aspect, the cooling unit is an electrostatic chuck configured to electrically attract the thin substrate, and the electrostatic chuck is configured to cool the thin substrate by attracting a surface of the thin substrate opposite to a processed surface thereof that is processed by the substrate processing unit.

According to this configuration, when the thin substrate is processed by the substrate processing unit, the thin substrate is supported and cooled by the electrostatic chuck. Accordingly, the rise in the temperature of the thin substrate and bending of the thin substrate are limited.

In a preferred aspect, the cooling unit is a gas cooling unit configured to supply a gas to the thin substrate, and the gas cooling unit is configured to cool the thin substrate by supplying the gas to a surface of the thin substrate opposite to a processed surface thereof that is processed by the substrate processing unit.

According to this configuration, when the thin substrate is processed by the substrate processing unit, the thin substrate is cooled by the gas from the gas cooling unit. Accordingly, bending of the thin substrate caused by a rise in the temperature of the thin substrate is limited.

In a preferred aspect, the thin substrate processing device further includes a tray attached to a circumference of the thin substrate, and a sealing member attached to the gas cooling unit at a location opposing the tray. The gas cooling unit is configured to supply the gas to a cooling void sealed by the sealing member.

According to this configuration, the gas from the gas cooling unit is supplied to the entire surface at the opposite side of the processed surface of the thin substrate. Therefore, as compared with when part of the surface is cooled, the rise in the temperature of the thin substrate can be limited.

In a preferred aspect, the tray is configured to pull the thin substrate from a center of the thin substrate toward a circumference of the thin substrate, and the gas cooling unit is configured to supply the gas when the thin substrate is pulled.

According to this configuration, because changes in the shape of the thin substrate are limited by the cooling gas, processing variations in the surface of the thin substrate can be limited.

In a preferred aspect, the substrate processing unit includes a film formation processing unit configured to form a thin film on the thin substrate by sputtering a target, and the gas cooling unit is configured to supply the gas also to a surface on which a thin film is formed by depositing sputtering grains on the thin substrate.

According to this configuration, because the gas is also supplied to the surface on which the thin film is formed in the thin substrate, the cooling effect of the thin substrate can be enhanced.

DESCRIPTION OF THE EMBODIMENTS

First Embodiment

A thin substrate processing device according to a first embodiment will now be described with reference to FIG. 1 to FIG. 12. In the present embodiment, the thin substrate processing device is a sputtering device, for example.

[Entire Configuration of Sputtering Device]

Figure 1:
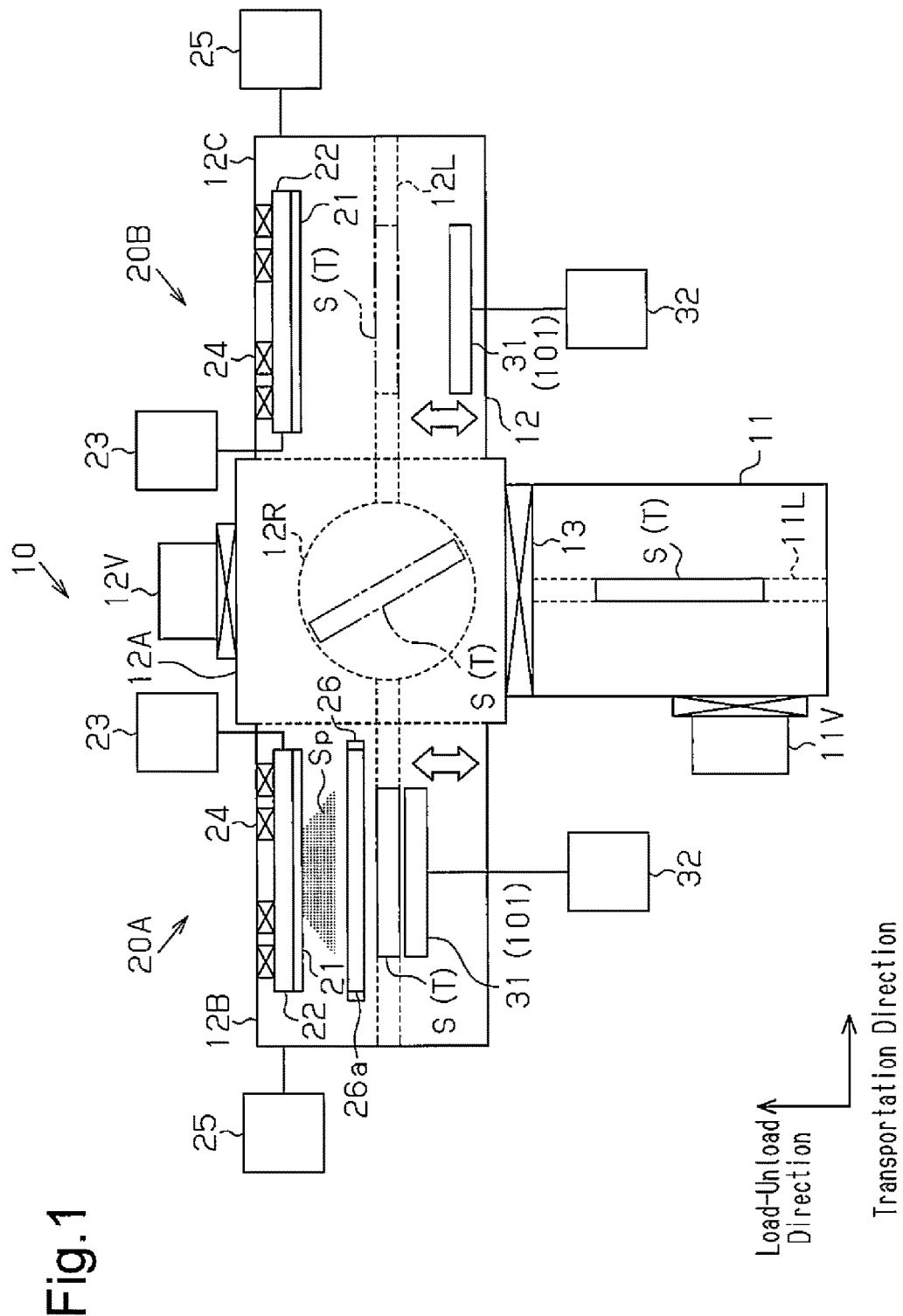
FIG. 1 is a plan view showing a schematic configuration of a sputtering device, and also shows a film substrate that is accommodated in the sputtering device.

The entire configuration of a sputtering device 10 will now be described with reference to FIG. 1. As shown in FIG. 1, the sputtering device 10 includes a load-unload chamber 11 and a vacuum chamber 12. The load-unload chamber 11 and the vacuum chamber 12 are formed in box shapes, for example. Between the load-unload chamber 11 and the vacuum chamber 12, a gate valve 13 connects or disconnects the load-unload chamber 11 and the vacuum chamber 12. The load-unload chamber 11 loads and unloads a film substrate S as an example of a thin substrate along a load-unload direction shown in FIG. 1. The vacuum chamber 12 transports the film substrate S along a transportation direction shown in FIG. 1. The load-unload chamber 11 is connected to approximately the center of the vacuum chamber 12 in the transportation direction.

An exhaust unit 11V that discharges gas from the load-unload chamber 11 is connected to the load-unload chamber 11. On the bottom surface of the load-unload chamber 11, a load-unload lane 11L that extends to the load-unload direction is set. The load-unload chamber 11 carries in the film substrate S before film formation that is attached to a frame-shaped tray T from the outside, and transports the film substrate S along the load-unload lane 11L and carries out the film substrate S to the vacuum chamber 12. The load-unload chamber 11 carries in the film substrate S after film formation from the vacuum chamber 12, and transports the film substrate S along the load-unload lane 11L and carries out the film substrate S to the outside.

The film substrate S is a resin-made substrate forming a rectangular plate shape, for example. The size of the film substrate S is 500 mm×600 mm, for example, and a thickness of the film substrate S is 80 μm, for example.

The material of the film substrate S may be an acrylic resin, a polyamide resin, a melamine resin, a polyimide resin, a polyester resin, or a cellulose resin, or a copolymer resin of these resins. Alternatively, the material of the film substrate S may be an organic natural compound such as gelatin and casein.

Preferably, the material of the film substrate S may be polyester, polyethylene terephthalate, polybutylene terephthalate, polymethylenemethacrylate, acrylic, polycarbonate, polystyrene, triacetate, polyvinyl alcohol, polyvinyl chloride, polyvinylidene chloride, polyethylene, ethylene-vinyl acetate copolymer, polyvinyl butyral, metal-ion cross-linked ethylene-methacrylic acid copolymer, polyurethane, or cellophane. More preferably, the material of the film substrate S may be any one of polyethylene terephthalate, polycarbonate, polymethylenemethacrylate, and triacetate.

The thin substrate is not limited to the film substrate, and may be a printed circuit board. For the printed circuit board, there can be used, for example, a paper phenol board, a glass epoxy substrate, a teflon substrate (Teflon is a registered trademark), a ceramic substrate such as alumina, or a rigid substrate such as a low temperature co-fired ceramics (LTCC) substrate. Alternatively, a metal wired layer may be used in any of these printed circuit boards. In order to enhance the effect by the technique of the present disclosure, the thickness of the thin substrate is preferably equal to or smaller than 1 mm, and is more preferably equal to or smaller than 100 μm.

The vacuum chamber 12 includes an inverting chamber 12A, a first film formation chamber 12B, and a second film formation chamber 12C. The inverting chamber 12A is located between the first film formation chamber 12B and the second film formation chamber 12C in the transportation direction. An exhaust unit 12V that exhausts the inside of the vacuum chamber 12 is connected to the inverting chamber 12A. On the bottom wall of the first film formation chamber 12B and the bottom wall of the second film formation chamber 12C, transportation lanes 12L are set as transporting units that extend to the transportation direction. Between the two transportation lanes 12L, a substrate rotating unit 12R is set within the inverting chamber 12A.

For example, the substrate rotating unit 12R includes a mounting section on which the film substrate S is mounted, and a rotary motor for rotating the mounting section around the axis which is orthogonal with the bottom wall of the inverting chamber 12A. The substrate rotating unit 12R arranges the film substrate S parallel to the transportation lane 12L, by rotating counterclockwise by 90 degrees, for example, the film substrate S which has been carried in from the load-unload chamber 11. In this state, the substrate rotating unit 12R changes the surface of the film substrate S that faces the gate valve 13, by rotating the film substrate S counterclockwise by 180 degrees.

The first film formation chamber 12B includes a first film formation unit 20A, and the second film formation chamber 12C includes a second film formation unit 20B. Each of the first film formation unit 20A and the second film formation unit 20B is an example of the substrate processing unit. The substrate rotating unit 12R is located between the first film formation unit 20A and the second film formation unit 20B in the transportation direction. The first film formation unit 20A and the second film formation unit 20B have the same configurations except that the two film formation units form different thin films. Therefore, in the following description, the configuration of the first film formation unit 20A will be described, and the description of the configuration of the second film formation unit 20B will be omitted.

The first film formation unit 20A includes a target 21 and a backing plate 22. The target 21 is provided at a position where the target 21 faces the film substrate S that has been loaded into the first film formation chamber 12B. That is, the target 21 has a first surface that faces the film substrate S and a second surface at the opposite side. The backing plate 22 is attached to the second surface of the target 21. A target power supply 23 that supplies electric power to the target 21 is connected to the backing plate 22. The main component of the formation material of the target 21 is titanium, for example. A magnetic circuit 24 is connected to the surface of the backing plate 22 at the opposite side of the target 21. The magnetic circuit 24 forms a leakage magnetic field on the first surface of the target 21 that faces the film substrate S. Further, the first film formation unit 20A includes a sputtering gas supply unit 25 that is connected to the sidewall of the first film formation chamber 12B and that supplies a sputtering gas into the first film formation chamber 12B. In the present embodiment, the sputtering gas supply unit 25 supplies an argon gas as the sputtering gas, for example. The sputtering gas may be a nitrogen gas, an oxygen gas, or a hydrogen gas, or may be a mixed gas prepared by mixing at least two of an argon gas, a nitrogen gas, an oxygen gas, and a hydrogen gas. In the present embodiment, the target 21, the backing plate 22, the target power supply 23, the magnetic circuit 24, and the sputtering gas supply unit 25 form a film formation processing unit.

In the first film formation unit 20A, while the sputtering gas supply unit 25 is supplying the argon gas into the first film formation chamber 12B, the target power supply 23 supplies high-frequency electric power, for example, to the target 21 through the backing plate 22. Accordingly, plasma is generated in the first film formation chamber 12B from the argon gas, and the first surface of the target 21 that faces the film substrate S is sputtered by positive ion in the plasma. As a result, sputtering grains Sp that include titanium as the main component is discharged toward the film substrate S.

In the second film formation unit 20B, the main component of the formation material of the target 21 is copper, for example. However, the main component of the formation material of the target 21 is not limited to titanium or copper, and may be chrome. Alternatively, the main component of the formation material of the target 21 may be an alloy that includes at least two of titanium, copper, and chrome.

A grounded plate-like shutter 26 is mounted between the target 21 and the transportation lane 12L within the first film formation chamber 12B. For example, the shutter 26 includes a shutter body having an opening 26a, a plate-like cover capable of moving between a closing position of closing the opening 26a and an opening position of opening the opening 26a, a shutter motor that generates driving force for driving the cover, and a rotation shaft for transmitting the driving force of the shutter motor to the cover. When the cover is moved to the closing position to close the opening 26a, the shutter 26 covers the entire surface of the target 21.

The substrate rotating unit 12R arranges the film substrate S parallel to the transportation lane 12L by rotating the film substrate S that has been loaded into the inverting chamber 12A. Then, the transportation lane 12L transports the film substrate S toward the first film formation unit 20A or the second film formation unit 20B. Accordingly, the film substrate S is transported from a non-processing position, at which the film substrate S does not face the target 21, to a processing position at which the entire film substrate S faces the target 21, along the transportation lane 12L. The first film formation unit 20A forms a thin film on the film substrate S that is located at the processing position within the first film formation chamber 12B, and the second film formation unit 20B forms a thin film on the film substrate S that is located at the processing position within the second film formation chamber 12C.

The first film formation chamber 12B and the second film formation chamber 12C each include an electrostatic chuck 31, serving as a cooling unit. The electrostatic chuck 31 of the first film formation chamber 12B is located corresponding to the processing position of the first film formation unit 20A. Similarly, the electrostatic chuck 31 of the second film formation chamber 12C is located corresponding to the processing position of the second film formation unit 20B. The electrostatic chuck 31 has a first surface that faces the film substrate S (the target 21), and a second surface at the opposite side. The electrostatic chuck 31 cools the film substrate S by electrically attracting the film substrate S that contacts the first surface of the electrostatic chuck 31. A position changing unit 32 that changes the position of the electrostatic chuck 31 in the load-unload direction (white arrow direction in FIG. 1) is coupled to the electrostatic chuck 31.

For example, the position changing unit 32 includes a shaft that is coupled to the second surface of the electrostatic chuck 31, a position changing motor that changes the position of the shaft along the load-unload direction, and a transmission unit that changes a rotational motion of the position changing motor to a linear motion and transfers the linear motion to the shaft. The position changing unit 32 moves the electrostatic chuck 31 in the load-unload direction, and changes a position of the electrostatic chuck 31 to between a contact position at which the electrostatic chuck 31 contacts the film substrate S and a non-contact position at which the electrostatic chuck 31 does not contact the film substrate S.

The electrostatic chuck 31 is moved to the contact position when the film substrate S has been loaded into the film formation chamber 12B or 12C and has been placed at the processing position, and is moved to the non-contact position when the film substrate S is unloaded from the film formation chamber 12B or 12C. That is, when the film substrate S is loaded into the film formation chamber and when the film substrate S is unloaded from the film formation chamber, the electrostatic chuck 31 is separated from the film substrate S. Therefore, the electrostatic chuck 31 does not contact the film substrate S during the transportation of the film substrate S, and damaging of the film substrate S and the electrostatic chuck 31 can be limited.

[Configuration of Electrostatic Chuck]

Figure 2:
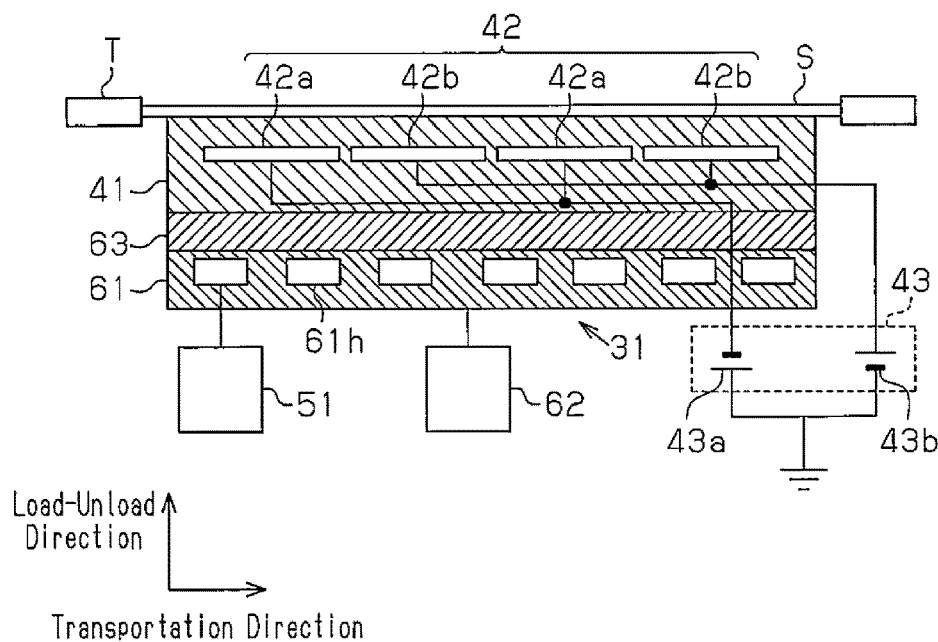
FIG. 2 is a cross-sectional view schematically showing a structure of an electrostatic chuck as an example of a cooling unit.

The configuration of the electrostatic chuck 31 will now be described with reference to FIG. 2. As shown in FIG. 2, the electrostatic chuck 31 includes an insulation plate 41. The material of the insulation plate 41 may be a ceramic such as aluminum oxide or a resin such as polyimide. The width (a horizontal direction on the paper) of the insulation plate 41 is smaller than the width of the film substrate S, and the length (a vertical direction on the paper) of the insulation plate 41 is smaller than the length of the film substrate S. That is, the size (a width×a length) of the insulation plate 41 is smaller than the size of the film substrate S.

The insulation plate 41 has a first surface that faces the film substrate S, and a second surface at the opposite side. In the insulation plate 41, a plurality of plate-like chuck electrodes 42 are located near the first surface of the insulation plate 41. The plurality of chuck electrodes 42 include a plurality of positive electrodes 42a to which a relatively positive voltage is applied, and a plurality of negative electrodes 42b to which a relatively negative voltage is applied. The number of the negative electrodes 42b is the same as that of the positive electrodes 42a. In the insulation plate 41, the positive electrodes 42a and the negative electrodes 42b are alternately arranged in the transportation direction. Each chuck electrode 42 is connected to a chuck power supply 43. The chuck power supply 43 includes a positive power supply 43a that supplies a relatively positive voltage, and a negative power supply 43b that supplies a relatively negative voltage. The positive power supply 43a is connected to the plurality of positive electrodes 42a, and the negative power supply 43b is connected to the plurality of negative electrodes 42b.

A plate-like bias electrode 61 is arranged on the second surface of the insulation plate 41 that does not face the film substrate S with a copper plate 63 located in between. The bias electrode 61 includes cooling holes 61h, serving as coolant passages through which a coolant that cools the bias electrode 61, the copper plate 63, and the insulation plate 41 flows. A coolant circulation unit 51 that supplies a coolant of a predetermined temperature is connected to the cooling hole 61h. The coolant may be a cooling liquid, such as cooling water, a fluorine-based solution, or an ethylene glycol solution, or a cooling gas such as a helium gas or an argon gas.

A bias high-frequency power supply 62 that supplies high-frequency electric power is connected to the bias electrode 61. Preferably, the bias high-frequency power supply 62 supplies high-frequency electric power having a frequency higher than or equal to 1 MHz and lower than or equal to 6 MHz, for example. Alternatively, the bias high-frequency power supply 62 may be configured to supply high-frequency electric power of a relatively high frequency, and high-frequency electric power of a relatively low frequency. In this case, preferably, the bias high-frequency power supply 62 supplies high-frequency electric power having a frequency higher than or equal to 13 MHz and lower than or equal to 28 MHz, and high-frequency electric power having a frequency higher than or equal to 100 kHz and lower than or equal to 1 MHz. In the present embodiment, the bias electrode 61, the bias high-frequency power supply 62, and the sputtering gas supply unit 25 configure a reverse sputtering unit. Further, the bias high-frequency power supply 62 configures a voltage application unit.

As described above, the insulation plate 41 of which a temperature has been controlled by the coolant contacts the film substrate S, so that the film substrate S is cooled. Therefore, for example, even when grains having high energy reach the film substrate S when forming a film on the film substrate S, the rise in the temperature of the film substrate S can be limited.

Further, as described above, the width (horizontal direction in the plane of the drawing) and the length (vertical direction in the plane of the drawing) of the insulation plate 41 are smaller than the width and the length of the film substrate S. Therefore, the circumference of the film substrate S becomes more difficult to cool than the center of the film substrate S. However, when the thin film of titanium or copper is formed on the film substrate S, the heat of the film substrate S is transferred to the metal film having higher thermal conductivity than that of the film substrate S and discharged through the metal film. Therefore, as compared with when the insulation film is formed on the film substrate S, the rise in the temperature of the film substrate S can be limited.

If high-frequency electric power is supplied from the bias high-frequency power supply 62 to the bias electrode 61 when the argon gas is being supplied from the sputtering gas supply unit 25 to the first film formation chamber 12B, plasma is generated in the first film formation chamber 12B from the argon gas. A bias voltage is applied to the film substrate S by supplying the high-frequency electric power to the bias electrode 61 when the electrostatic chuck 31 is attracting the film substrate S. Accordingly, the positive ions in the plasma are drawn into the film substrate S, and the surface of the film substrate S not facing the electrostatic chuck 31 is reversely sputtered.

[Configuration of Transportation Lane]

Figure 3:
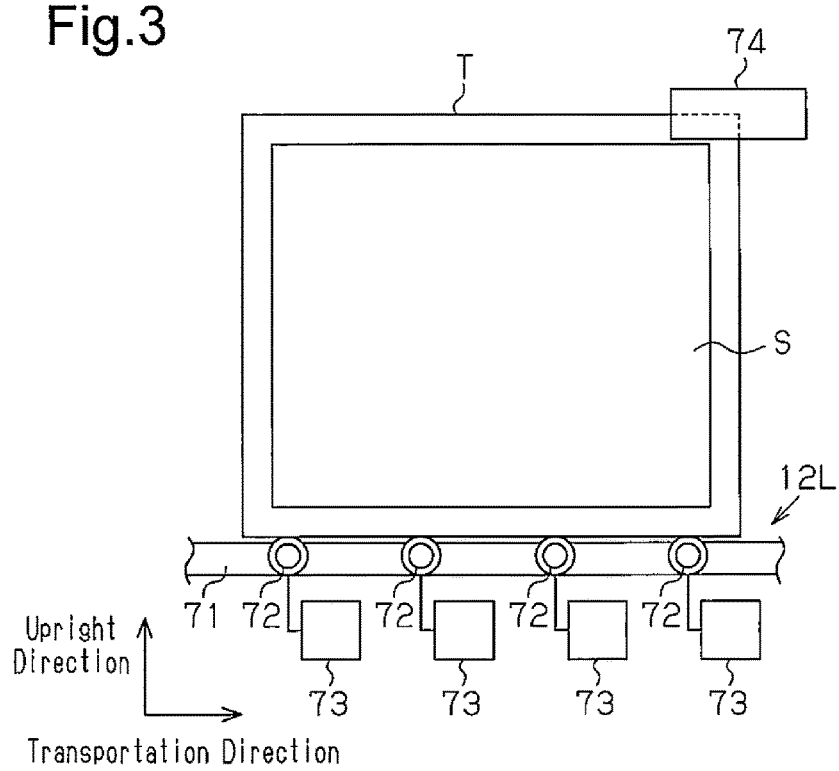
FIG. 3 is a view showing the configuration of a transportation lane, together with the film substrate as an object to be transported.

The configuration of the transportation lane 12L will now be described with reference to FIG. 3 and FIG. 4. FIG. 3 shows when the film substrate S is located at the processing position of the first film formation unit 20A. The transportation lane 12L that is set in the first film formation chamber 12B and the transportation lane 12L that is set in the second film formation chamber 12C have the same configuration. Therefore, the configuration of the transportation lane 12L that is set in the first film formation chamber 12B will be described below, and the description of the configuration of the transportation lane 12L that is set in the second film formation chamber 12C will be omitted.

As shown in FIG. 3, the transportation lane 12L includes a transportation rail 71 that extends along the transportation direction, and a plurality of transportation rollers 72 that arranged at predetermined intervals in the transportation rail 71. Each of the transportation rollers 72 is rotationally supported by the transportation rail 71. A transportation motor 73 is coupled to each transportation roller 72. Each transportation motor 73 rotates a corresponding transportation roller 72 in two directions by producing rotation in a forward direction and a reverse direction.

The film substrate S that is supported by the tray T is mounted on the transportation rail 71 in an upright state. Hereinafter, a height direction of the film substrate S will be called an upright direction. By rotating the transportation rollers 72, the tray T on the transportation rail 71 is transported together with the film substrate S, from the substrate rotating unit 12R toward the film formation unit 20A or 20B, or from each processing position toward the substrate rotating unit 12R. As described above, the transportation lane 12L transports the film substrate S while supporting the lower end of the film substrate S in the upright direction.

A substrate fixing unit 74 fixes the film substrate S at the processing position on the upper wall of the first film formation chamber 12B at a position where the substrate fixing unit 74 faces part of the transportation lane 12L. The substrate fixing unit 74 fixes the film substrate S to the processing position by holding the upper end of the tray T in the upright direction of the film substrate S.

Figure 4:
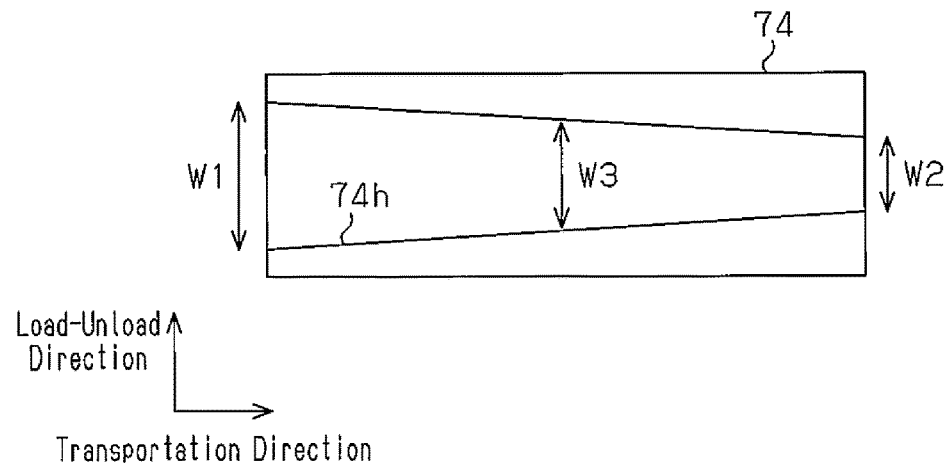
FIG. 4 is a plan view showing the structure of a substrate fixing unit viewed from a lower side in an upright direction.

As shown in FIG. 4, the substrate fixing unit 74, which is cylindrical and extends in the transportation direction, includes a holding groove 74h is formed at the lower end in the upright direction. The holding groove 74h is formed so that the groove width of the holding groove 74h varies the transportation direction. In the present embodiment, a groove width W1 of a first end of the holding groove 74h at the side closer to the substrate rotating unit 12R is the largest, and a groove width W2 of a second end of the holding groove 74h that is located at the side farther from the substrate rotating unit 12R is the smallest. Further, a groove width of the holding groove 74h becomes gradually smaller from the groove width W1 toward the groove width W2. An intermediate position of the holding groove 74h in the transportation direction has a groove width W3 that is equal to the width of the tray T. Therefore, when the upper edge of the tray T transported along the transportation lane 12L is inserted into the substrate fixing unit 74 and reaches the intermediate position of the holding groove 74h, the position of the tray T is fixed to the processing position.

[Electrical Configuration of Sputtering Device]

An electrical configuration of the sputtering device 10 will now be described with reference to FIG. 5. In the following, only the configuration concerning the drive control of the vacuum chamber 12 will be described.

Figure 5:
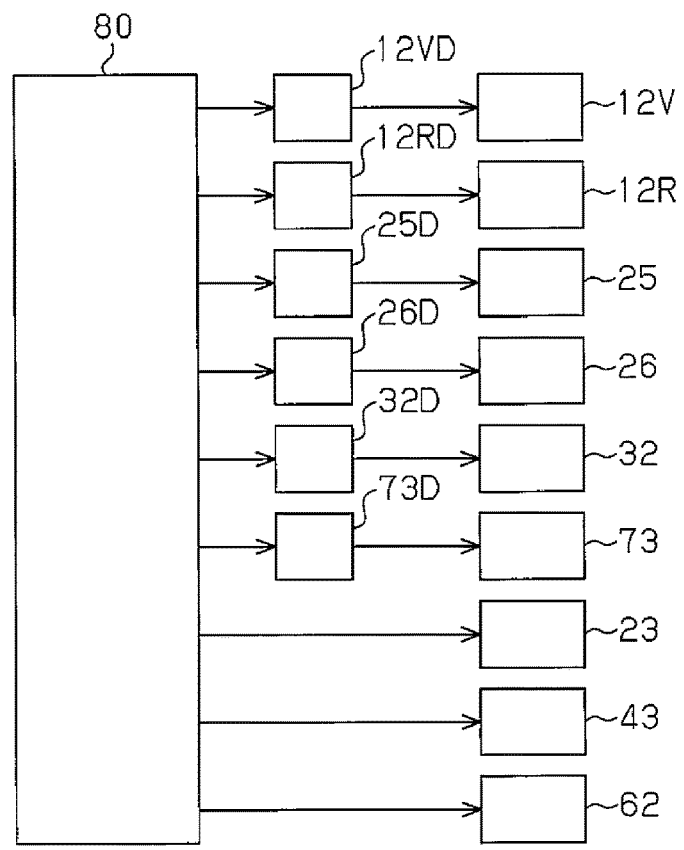
FIG. 5 is a block diagram showing an electrical configuration of a sputtering device according to a first embodiment.

As shown in FIG. 5, the sputtering device 10 includes a controller 80 that controls the drive of the sputtering device 10. The controller 80 is electrically connected to the exhaust unit 12V, the substrate rotating unit 12R, the sputtering gas supply unit 25, the shutter 26, the position changing unit 32, the transportation motor 73, the target power supply 23, the chuck power supply 43, and the bias high-frequency power supply 62.

The controller 80 provides an exhaust unit driving circuit 12VD with a drive starting signal for starting the driving of the exhaust unit 12V, and a drive stopping signal for stopping the driving of the exhaust unit 12V. The exhaust unit driving circuit 12VD drives the exhaust unit 12V according to the drive starting signal, and stops the drive of the exhaust unit 12V according to the drive stopping signal.

The controller 80 provides a substrate rotating unit driving circuit 12RD with a drive starting signal for starting the driving of the substrate rotating unit 12R (particularly, the rotary motor), and a drive stopping signal for stopping the driving of the substrate rotating unit 12R. The substrate rotating unit driving circuit 12RD drives the substrate rotating unit 12R according to the drive starting signal, and stops the drive of the substrate rotating unit 12R according to the drive stopping signal.

The controller 80 provides a sputtering gas supply unit driving circuit 25D with a supply starting signal for starting the supply of the sputtering gas from the sputtering gas supply unit 25, and a supply stopping signal for stopping the supply of the sputtering gas from the sputtering gas supply unit 25. The sputtering gas supply unit driving circuit 25D drives the sputtering gas supply unit 25 in response to the supply starting signal, and stops the drive of the sputtering gas supply unit 25 in response to the supply stopping signal.

The controller 80 provides a shutter driving circuit 26D with a drive starting signal for starting the driving of the shutter 26 (particularly, the shutter motor), and a drive stopping signal for stopping the driving of the shutter 26. The shutter driving circuit 26D drives the shutter 26 in response to the drive starting signal, and stops the drive of the shutter 26 in response to the drive stopping signal.

The controller 80 provides a position changing unit driving circuit 32D with a drive starting signal for starting the driving of the position changing unit 32 (particularly, the position changing motor), and a drive stopping signal for stopping the driving of the position changing unit 32. The position changing unit driving circuit 32D drives the position changing unit 32 in response to the drive starting signal, and stops the drive of the position changing unit 32 in response to the drive stopping signal.

The controller 80 provides a transportation-motor driving circuit 73D with a drive starting signal for starting the driving of the transportation motor 73, and a drive stopping signal for stopping the driving of the transportation motor 73. The transportation-motor driving circuit 73D drives the transportation motor 73 in response to the drive starting signal, and stops the drive of the transportation motor 73 in response to the drive stopping signal.

The controller 80 provides the target power supply 23 with a supply starting signal for starting the supply of electric power from the target power supply 23, and a supply stopping signal for stopping the supply of electric power from the target power supply 23. The target power supply 23 starts and stops the supply of electric power in response to the supply starting signal and the supply stopping signal.

The controller 80 provides the chuck power supply 43 with a supply starting signal for starting the supply of electric power from the chuck power supply 43, and a supply stopping signal for stopping the supply of electric power from the chuck power supply 43. The chuck power supply 43 starts and stops the supply of electric power in response to the supply starting signal and the supply stopping signal.

The controller 80 provides the bias high-frequency power supply 62 with a supply starting signal for starting the supply of electric power from the bias high-frequency power supply 62, and a supply stopping signal for stopping the supply of electric power from the bias high-frequency power supply 62. The bias high-frequency power supply 62 starts and stops the supply of electric power in response to the supply starting signal and the supply stopping signal.

[Film Formation Processing in Sputtering Device]

A driving state of the sputtering device 10 when performing the film formation processing in the vacuum chamber 12 will now be described with reference to FIGS. 6 to 9. In FIGS. 6 to 9, the load-unload chamber 11 is not shown to facilitate understanding.

In the vacuum chamber 12 of the sputtering device 10, the reverse sputtering for cleaning the surface (the film formation surface) of the film substrate S before film formation, the adhesion layer formation processing, and the seed layer formation processing are sequentially performed. On the surface of the film substrate S, the insulation layer is formed using a glass epoxy resin, for example. Hereinafter, the operation of the sputtering device 10 will be described in the order of the reverse sputtering, the adhesion layer formation processing, and the seed layer formation processing.

Figure 6:
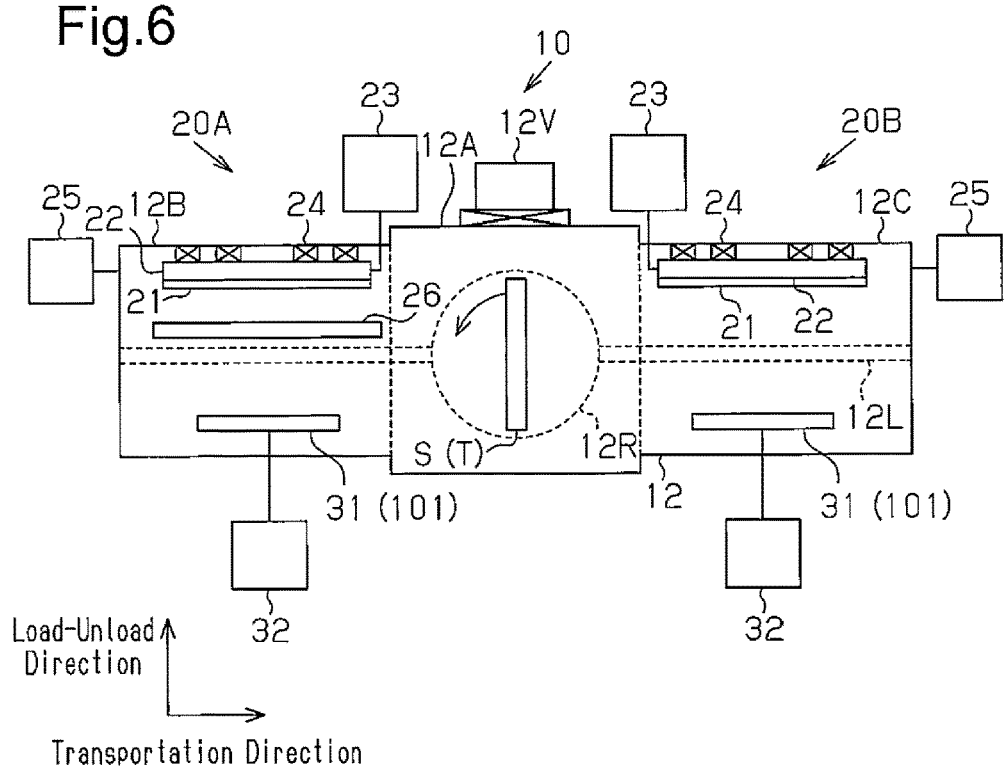
FIG. 6 is a view showing a state of driving the sputtering device when a film formation processing is performed.

As shown in FIG. 6, when performing the film formation processing to the film substrate S, first, the controller 80 generates a drive starting signal to the substrate rotating unit 12R (the rotary motor). In response to the drive starting signal, the substrate rotating unit 12R rotates counterclockwise by 90 degrees the film substrate S which is mounted on the mounting section. Accordingly, the tray T is located on the transportation lane 12L of the first film formation chamber 12B. Before the film substrate S is loaded into the vacuum chamber 12, the controller 80 generates a drive starting signal to the exhaust unit 12V, and the exhaust unit 12V discharges gas from the inside of the vacuum chamber 12. Accordingly, the inside of the vacuum chamber 12 is decompressed to a predetermined pressure level. The cover of the shutter 26 is located at the closing position and closes the opening 26a.

After the film substrate S has been loaded into the first film formation chamber 12B, the controller 80 generates a supply starting signal for driving the two sputtering gas supply units 25. In response to the supply starting signal, each sputtering gas supply unit 25 starts supplying the argon gas into the vacuum chamber 12 at a predetermine flow rate and holds a predetermined pressure in the vacuum chamber 12. The two sputtering gas supply units 25 may supply argon gas at the same flow rate or at a different flow rate.

Then, the controller 80 generates a drive starting signal for driving the transportation motor 73. When the transportation motor 73 has been driven in response to the drive starting signal, the film substrate S is transported from the non-processing position to the processing position opposite to the target 21 of the first film formation unit 20A along the transportation lane 12L. Thereafter, when the film substrate S has reached the processing position, the controller 80 generates a drive stopping signal for stopping the driving of the transportation motor 73. As a result, the transportation of the film substrate S stops. At this time, the film substrate S is fixed by holding the upper edge of the tray T in the holding groove 74h of the substrate fixing unit 74.

Figure 7:
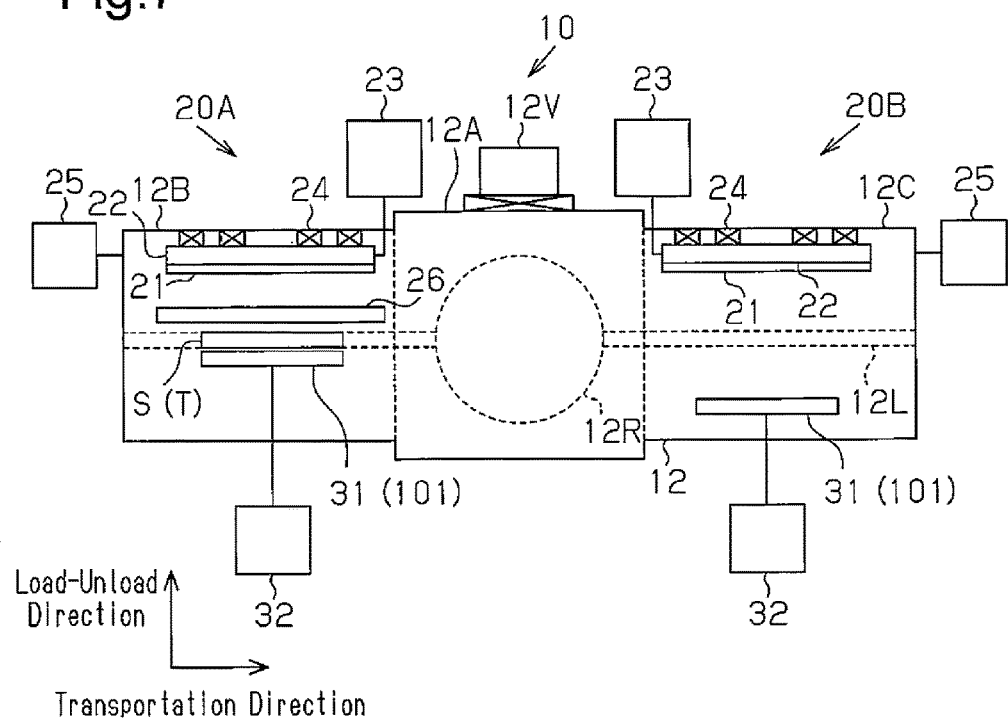
FIG. 7 is a view showing a state of driving the sputtering device when a film formation processing is performed.

As shown in FIG. 7, next, the controller 80 generates a drive starting signal for driving the position changing unit 32 (the position changing motor). In response to the drive starting signal, the position changing unit 32 of the first film formation unit 20A moves the electrostatic chuck 31 from the non-contact position to the contact position. At this time, the tray T is fixed to the substrate fixing unit 74. Thus, even when the electrostatic chuck 31 contacts the tray T, variations in the position of the film substrate S can be limited.

Next, the controller 80 generates a supply starting signal for driving the chuck power supply 43. In response to the supply starting signal, the chuck power supply 43 supplies electric power to the positive electrode 42a and the negative electrode 42b of the insulation plate 41. Accordingly, a potential difference is generated at the first surface of the insulation plate 41 that faces the film substrate S, and the film substrate S is attracted by the electrostatic chuck 31.

Next, the controller 80 generates a supply starting signal for driving the bias high-frequency power supply 62 of the first film formation unit 20A. In response to the supply starting signal, the bias high-frequency power supply 62 starts supplying the high-frequency electric power to the bias electrode 61.

Accordingly, plasma is generated in the first film formation chamber 12B from the argon gas, and the positive ions in the plasma are drawn toward the film substrate S. As a result, the surface of the film substrate S that faces the target 21 is reversely sputtered, and foreign matter or the like is removed from the film substrate S. That is, the surface (the film formation surface) of the film substrate S is cleaned by the reverse sputtering. At this time, the film substrate S is cooled by the electrostatic chuck 31. Thus, rises in the temperature of the film substrate S can be limited. Further, the first surface of the target 21 that faces the film substrate S is covered by the shutter 26. Thus, grains discharged from the film substrate S subtly adhere to the surface of the target 21.

As described above, even when the surface cleaning processing by the reverse sputtering of the film substrate S and the film formation processing to the film substrate S are performed in the same first film formation chamber 12B, the thin film that is formed on the film substrate S contains few grains that have been discharged from the film substrate S. Further, the cleaning processing of the surface of the target 21 that faces the film substrate S can be omitted before performing the film formation of the film substrate S. Thus, the number of film formation processing processes that are performed in the vacuum chamber 12 can be reduced.

After the reverse sputtering of the film substrate S has been performed over a predetermined period of time, the controller 80 generates a supply stopping signal for stopping the driving of the bias high-frequency power supply 62. In response to the supply stopping signal, the bias high-frequency power supply 62 stops supplying the high-frequency electric power to the bias electrode 61. Accordingly, the reverse sputtering of the film substrate S is completed.

Figure 8:
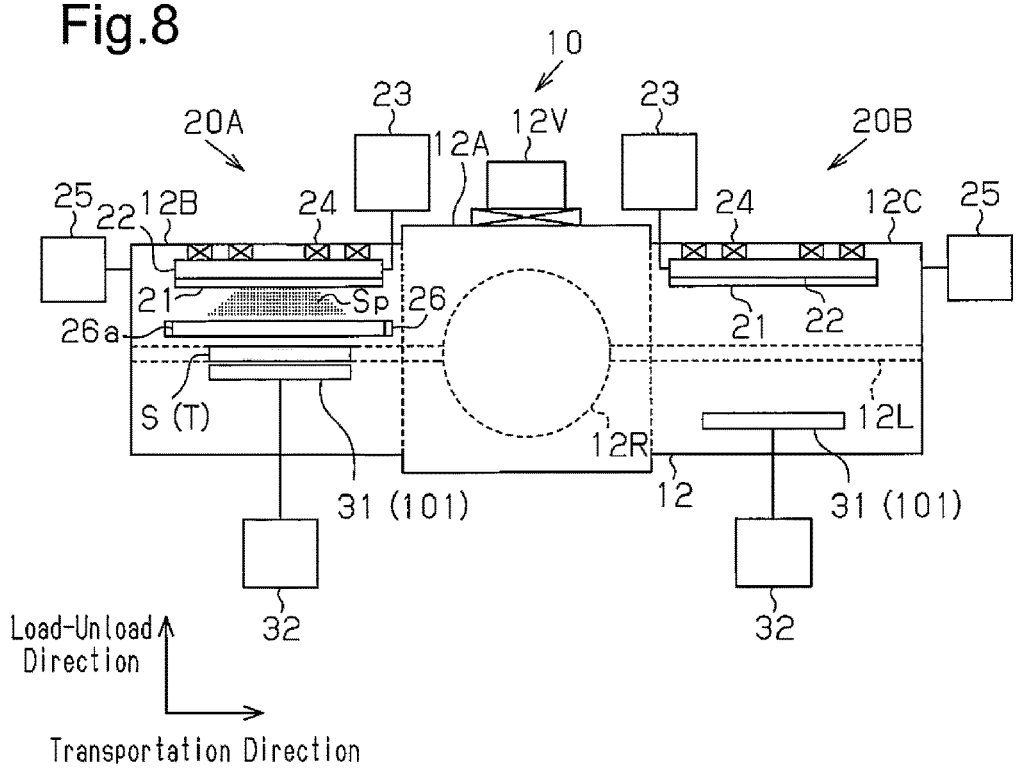
FIG. 8 is a view showing a state of driving the sputtering device when a film formation processing is performed.

As shown in FIG. 8, next, the controller 80 generates a drive starting signal for driving the shutter 26 (the shutter motor). In response to the drive starting signal, the shutter 26 moves the cover to the opening position to open the opening 26a. Next, the controller 80 generates a supply starting signal for driving the target power supply 23. In response to the supply starting signal, the target power supply 23 supplies electric power to the target 21 through the backing plate 22. Accordingly, plasma is generated in the first film formation chamber 12B from the argon gas, and the first surface of the target 21 that faces the film substrate S is sputtered by the positive ion in the plasma. In this way, a thin film of titanium is formed on the film substrate S as an adhesion layer, by discharging the sputtering grains Sp that contain titanium as a main component from the target 21 toward the film substrate S.

The argon gas is continuously supplied into the first film formation chamber 12B during both processes of the reverse sputtering of the film substrate S and the formation of the adhesion layer. Therefore, the pressure in the first film formation chamber 12B remains substantially the same. Consequently, as compared with when stopping the supply of the argon gas simultaneously with when completing the reverse sputtering of the film substrate S, plasma can be efficiently generated in the first film formation chamber 12B from the argon gas at the formation start time of the adhesion layer. Further, the film substrate S is continued to be cooled by being attracted by the electrostatic chuck 31 during both processes of the reverse sputtering of the film substrate S and the formation of the adhesion layer. Therefore, as compared with when stopping the attraction (cooling) of the film substrate S to the electrostatic chuck 31 simultaneously with when completing the reverse sputtering of the film substrate S, the period during which the film substrate S is cooled becomes longer. As a result, the rise in the temperature of the film substrate S can be effectively limited.

After the formation of the adhesion layer has been performed over a predetermined period of time, the controller 80 generates a supply stopping signal for stopping the driving of the target power supply 23. In response to the supply stopping signal, the target power supply 23 completes the formation of the adhesion layer on the film substrate S by stopping the supply of electric power to the backing plate 22 (the target 21). Thereafter, the controller 80 generates a supply stopping signal for stopping the driving of the chuck power supply 43, and the electrostatic chuck 31 cancels the attraction of the film substrate S in response to the supply stopping signal. The controller 80 generates a drive starting signal for driving the shutter 26 (the shutter motor), and the shutter 26 moves the cover to the closing position and closes the opening 26a in response to the drive starting signal.

Figure 9:
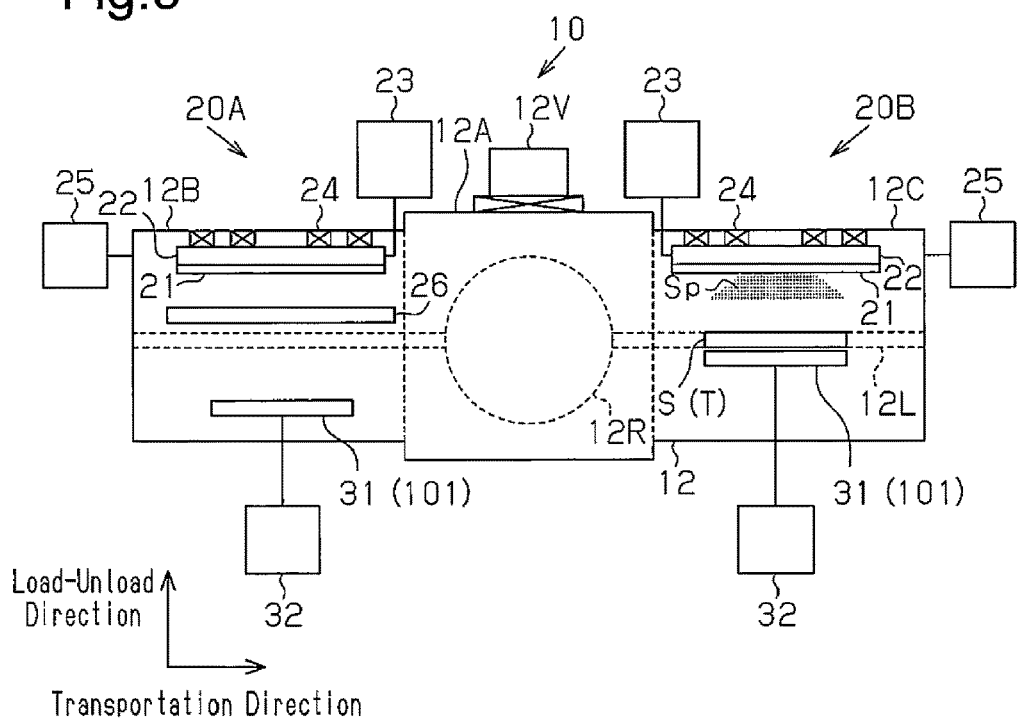
FIG. 9 is a view showing a state of driving the sputtering device when a film formation processing is performed.

As shown in FIG. 9, next, the controller 80 generates a drive starting signal for driving the position changing unit 32 (the position changing motor). In response to the drive starting signal, the position changing unit 32 of the first film formation unit 20A moves the electrostatic chuck 31 from the contact position to the non-contact position. Next, the controller 80 generates a drive starting signal for driving the transportation motor 73. When the transportation motor 73 is driven in response to the drive starting signal, the upper edge of the tray T moves out of the holding groove 74h of the substrate fixing unit 74, and the film substrate S is transported toward the substrate rotating unit 12R along the transportation lane 12L.

When the film substrate S is moved to the substrate rotating unit 12R, the substrate rotating unit 12R transports the film substrate S to the transportation lane 12L of the second film formation unit 20B without rotating the film substrate S. Next, the controller 80 generates a drive starting signal for driving the transportation motor 73 of the second film formation chamber 12C. As a result, the film substrate S is transported from the non-processing position toward the processing position of the second film formation unit 20B along the transportation lane 12L. When the film substrate S reaches the processing position, the controller 80 generates a drive stopping signal for stopping the driving of the transportation motor 73. Accordingly, the transportation of the film substrate S stops. The film substrate S is fixed by holding the upper edge of the tray T in the holding groove 74h of the substrate fixing unit 74.

Next, the controller 80 generates a drive starting signal for driving the position changing unit 32 (the position changing motor). In response to the drive starting signal, the position changing unit 32 of the second film formation unit 20B moves the electrostatic chuck 31 from the non-contact position to the contact position. At this time, the tray T is being fixed to the substrate fixing unit 74. Thus, even when the electrostatic chuck 31 contacts the tray T, variations in the position of the film substrate S are limited.

Thereafter, the controller 80 generates a supply starting signal for driving the chuck power supply 43. In response to the supply starting signal, the chuck power supply 43 supplies electric power to the positive electrode 42a and the negative electrode 42b of the insulation plate 41. Accordingly, the electrostatic chuck 31 attracts the film substrate S by forming a potential difference at the first surface of the insulation plate 41 that faces the film substrate S.

Next, the controller 80 generates a supply starting signal for driving the target power supply 23 of the second film formation unit 20B. In response to the supply starting signal, the target power supply 23 supplies electric power to the target 21 through the backing plate 22. Accordingly, plasma is generated in the second film formation chamber 12C from the argon gas, and the first surface of the target 21 that faces the film substrate S is sputtered by the positive ion in the plasma. As a result, the sputtering grains Sp that contain copper as a main component are discharged from the target 21 toward the film substrate S, and a thin film of the copper as the seed layer is formed on the film substrate S. At this time, the film substrate S has been cooled by the electrostatic chuck 31. Thus, rises in the temperature of the film substrate S are limited.

After the formation of the seed layer has been performed over a predetermined period of time, the controller 80 generates a supply stopping signal for stopping the driving of the target power supply 23. In response to the supply stopping signal, the target power supply 23 completes the formation of the seed layer by stopping the supply of electric power to the backing plate 22 (the target 21). Next, the controller 80 generates a supply stopping signal for stopping the driving of the chuck power supply 43, and the electrostatic chuck 31 cancels the attraction of the film substrate S in response to the supply stopping signal.

Next, the controller 80 generates a supply stopping signal for stopping the driving of each of the two sputtering gas supply units 25, and each supply stopping unit 25 stops supplying the argon gas into the vacuum chamber 12 in response to the supply stopping signal.

As described above, the argon gas is continuously supplied into the vacuum chamber 12 from the start of the reverse sputtering of the film substrate S to the end of the formation of the adhesion layer and the seed layer. Therefore, during a series of the processes of the reverse sputtering, the formation processing of the adhesion layer, and the formation processing of the seed layer, the pressure in the vacuum chamber 12 hardly changes. Therefore, when forming the adhesion layer and the seed layer, plasma can be efficiently generated in the vacuum chamber 12.

In the present embodiment, the reverse sputtering, the adhesion layer formation processing, and the seed layer formation processing can be performed on both surfaces of the film substrate S. In this case, after the reverse sputtering, the adhesion layer formation processing, and the seed layer formation processing have all been performed on one surface of the film substrate S, the film substrate S is turned by 180° by the substrate rotating unit 12R. Due to this arrangement, the reverse sputtering, the adhesion layer formation processing, and the seed layer formation processing can be also performed on the other surface of the film substrate S. Alternatively, after the reverse sputtering and the adhesion layer formation processing have been performed to each surface of the film substrate S, the seed layer formation processing may be performed to each surface.

Example 1

Figure 10:
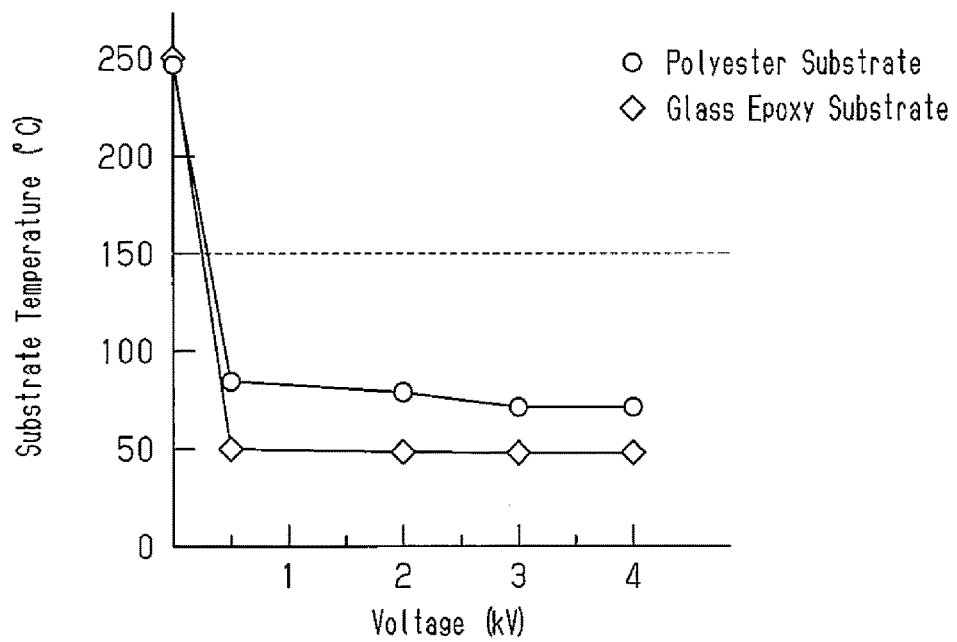
FIG. 10 is a graph showing the relationship between a voltage applied to a chuck electrode and a substrate temperature according to Example 1.

After preparing a printed circuit board and a film substrate made of polyester resin, when forming a copper film on the printed circuit board and the film substrate, the voltage supplied to the chuck electrode of the electrostatic chuck was changed between the printed circuit board and the film substrate. Then, temperatures of the printed circuit board and the film substrate when forming the copper film at each voltage were measured. FIG. 10 shows the measurement result. In FIG. 10, the vertical axis shows a substrate temperature, and the horizontal axis shows the voltage (an absolute value) applied to the chuck electrode.

The printed circuit board was a substrate obtained by stacking a copper film and a glass epoxy resin layer on a glass epoxy substrate obtained by forming a copper foil on both surfaces of a film obtained by fixing a glass cloth (a core material) with the epoxy resin. A thickness of the printed circuit board was 80 µm, and a thickness of the film substrate made of the polyester resin was 300 µm. The formation of the copper film was performed under the following condition. The film formation time means the time from the start of the film formation to the measurement of the temperature of the printed circuit board or the temperature of the film substrate.

target: copper
    output of target power supply: 40 kW
    film formation time: one minute
    coolant: cooling water
    coolant temperature: 25° C.

As shown in FIG. 10, when a voltage was not being applied to the electrostatic chuck, the temperature of the printed circuit board and the temperature of the film substrate were both 250° C. When a voltage of 0.5 kV was applied to the chuck electrode, the temperature of the printed circuit board was limited to about 50° C. Further, also when a voltage applied to the chuck electrode was larger than 0.5 kV, the temperature of the printed circuit board was limited to about 50° C.

When a voltage of 0.5 kV was applied to the chuck electrode, the temperature of the film substrate was limited to about 70° C. Further, when a voltage applied to the chuck electrode was larger than 0.5 kV, the temperature of the film substrate was limited to about 70° C.

As described above, by cooling the printed circuit board and the film substrate with the electrostatic chuck, the temperature of the printed circuit board and the temperature of the film substrate are both held at or below 150° C. as the temperature at which the printed circuit board and the film substrate deform.

Example 2

Figure 11:
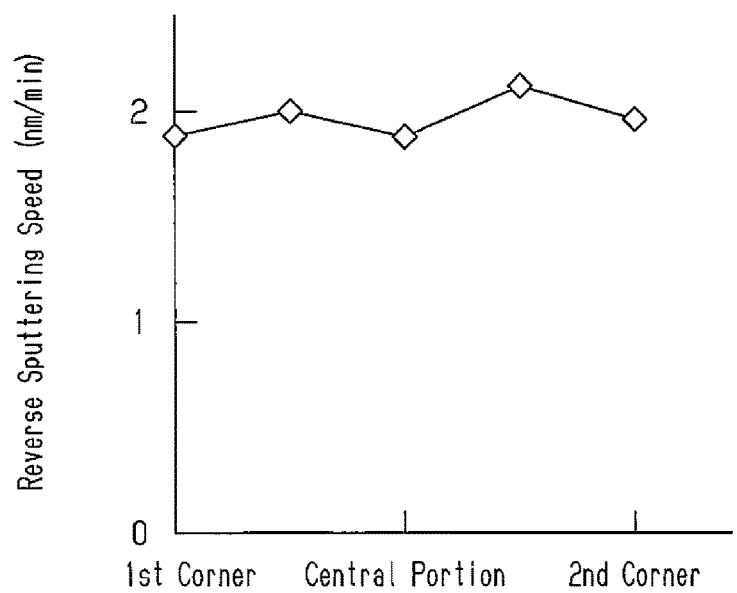
FIG. 11 is a graph showing the distribution of a reverse sputtering speed according to Example 2.

After reverse sputtering was performed on the surface of the insulation substrate made of glass epoxy resin, reverse sputtering speeds were measured at different positions with an effective range of the reverse sputtering of the insulation substrate. The size of the effective range of the reverse sputtering was 500 mm×600 mm, and the reverse sputtering was performed under the following condition. Reverse sputtering speeds were measured at two corners (first corner and second corner) located on a diagonal line in the effective range of the reverse sputtering, a central portion, and between each corner and the central portion. FIG. 11 shows the measurement result.

substrate: glass epoxy resin substrate
    sputtering gas: argon gas
    flow rate: 200 sccm
    frequency: 2 MHz
    electric power amount: 730 W
    pressure: 2 Pa As shown in FIG. 11, the reverse sputtering speed at the central portion of the effective range of the reverse sputtering was 1.9 nm/min, and variations in the reverse sputtering speeds in the entire effective range of the reverse sputtering was ±7.3%. When the frequency of the high-frequency electric power supplied from the bias high-frequency power supply is in the range from 1 MHz or higher to 6 MHz or lower, a result equivalent to the result shown in FIG. 11 was obtained.

Example 3

Figure 12:
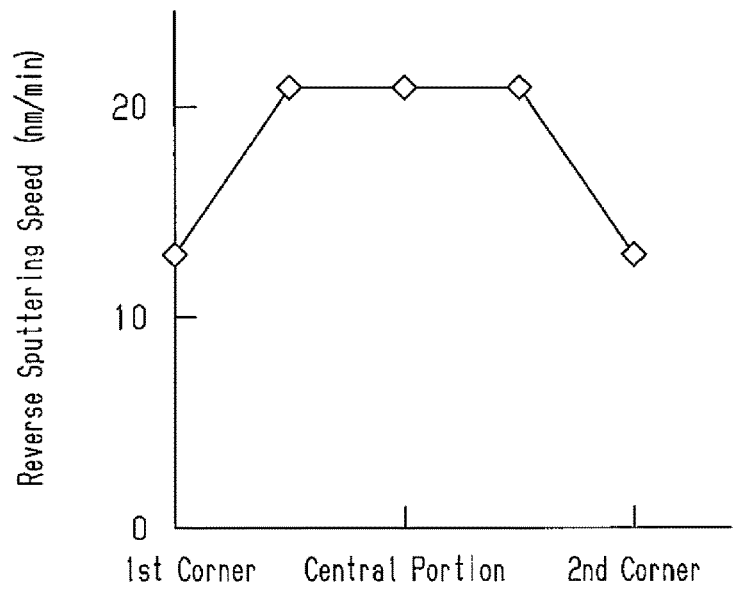
FIG. 12 is a graph showing the distribution of a reverse sputtering speed according to Example 3.

In the same manner as Example 2, after reverse sputtering was performed on the surface of the insulation substrate made of glass epoxy resin, reverse sputtering speeds were measured at different positions in an effective range of the reverse sputtering of the insulation substrate. However, in Example 3, the reverse sputtering was performed under the following conditions. Measurement positions in the effective range of the reverse sputtering are positions similar to those in Example 2. FIG. 12 shows the measurement result.

substrate: glass epoxy resin substrate
sputtering gas: argon gas
flow rate: 200 sccm
frequency (high frequency): 13.56 MHz
electric power amount (high frequency): 730 W
frequency (low frequency): 200 kHz
electric power amount (low frequency): 805 W
pressure: 2 Pa As shown in FIG. 12, the reverse sputtering speed at the central portion of the effective range of the reverse sputtering was 21.1 nm/min, and variations in the reverse sputtering speeds in the entire effective range of the reverse sputtering was ±23.7%. A result equivalent to the result shown in FIG. 12 was also obtained when electric power having a relatively high frequency (higher than or equal to 13 MHz and lower than or equal to 28 MHz) and electric power having a relatively low frequency (higher than or equal to 100 kHz and lower than or equal to 1 MHz) were supplied as the bias high-frequency electric power.

Comparative Example

Figure 13:
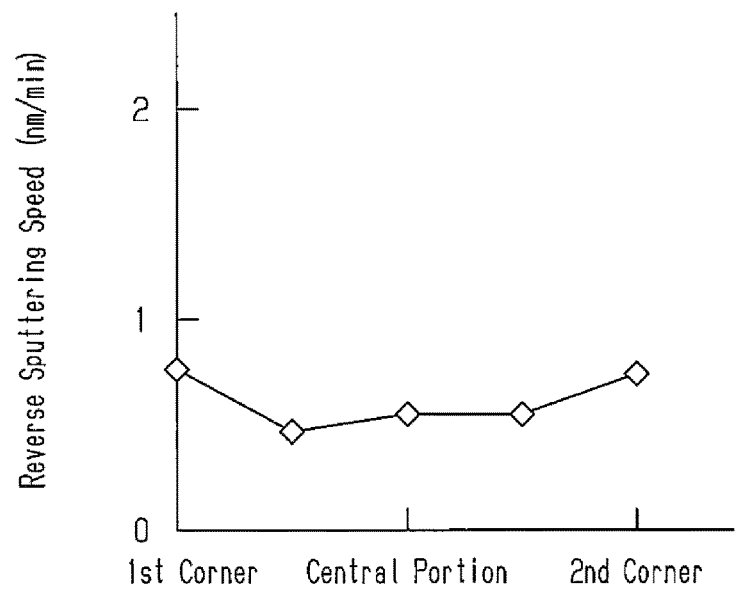
FIG. 13 is a graph showing the distribution of a reverse sputtering speed according to a comparative example.

Like in Example 2, after reverse sputtering was performed on the surface of the insulation substrate made of glass epoxy resin, reverse sputtering speeds were measured at different positions with an effective range of the reverse sputtering of the insulation substrate. In the comparative example, the reverse sputtering was performed under the following condition. Measurement positions in the effective range of the reverse sputtering are positions similar to those in Example 2. FIG. 13 shows the measurement result.

substrate: glass epoxy resin substrate
sputtering gas: argon gas
flow rate: 200 sccm
frequency: 13.56 MHz
electric power amount: 730 W
pressure: 0.7 Pa As shown in FIG. 13, the reverse sputtering speed at the central portion of the effective range of the reverse sputtering was 0.4 nm/min, and variations in the reverse sputtering speeds in the entire effective range of the reverse sputtering was ±42.0%.

As can be understood from Example 2 and the comparative example, when performing the reverse sputtering of the film substrate, it is desirable that the frequency of the high-frequency electric power supplied from the bias high-frequency power supply is set higher than or equal to 1 MHz and lower than or equal to 6 MHz. In this case, the reverse sputtering speed is increased, and variations in the reverse sputtering speed in the surface of the film substrate are small. Further, as shown in Example 3, the reverse sputtering speed is also increased and variations in the reverse sputtering speed in the surface of the film substrate are also small when a relatively high frequency (refer to the following description) is supplied from the bias high-frequency power supply and when a relatively low frequency (refer to the following description) is supplied from the bias high-frequency power supply.

high frequency: higher than or equal to 13 MHz and lower than or equal to 28 MHz
Low frequency: higher than or equal to 100 kHz and lower than or equal to 1 MHz As described above, the thin substrate processing device according to the first embodiment has the following advantages.

(1) During a period when the sputtering grains having high energy are being discharged to the film substrate, the electrostatic chuck 31 cools the film substrate S by attracting the film substrate S. Therefore, rises in the temperature of the film substrate S can be limited as compared with when using a configuration in which cooling is not performed.

(2) The film substrate S is transported along the transportation lane 12L when the electrostatic chuck 31 has moved to the non-contact position at which the electrostatic chuck 31 does not contact the film substrate S. Therefore, when the film substrate S is transported, friction between the film substrate S and the electrostatic chuck 31 is limited.

(3) When the film substrate S has been transported to the processing position, the lower end of the film substrate S is supported by the transportation lane 12L, and the upper end of the film substrate S is held by the substrate fixing unit 74. Accordingly, the film substrate S is fixed at the processing position. Consequently, even when the electrostatic chuck 31 contacts the film substrate S at the processing position, displacement of the film substrate S is limited.

(4) The substrate fixing unit 74 is configured such that the groove width of the substrate fixing unit 74 varies in the transportation direction. Accordingly, when the film substrate S has been transported together with the tray T to the processing position, the upper edge of the tray T is fixed by the substrate fixing unit 74. Consequently, while simplifying the configuration of the substrate fixing unit 74, the position of the film substrate S can be easily fixed.

(5) The reverse sputtering (cleaning processing) of the film substrate S is performed when the surface of the target 21 is covered by the shutter 26. Therefore, even when the bias electrode 61 used for the cleaning of the film substrate S is set together with the target 21 in the same first film formation chamber 12B, adhesion of the grains discharged from the film substrate S to the surface of the target 21 can be limited by the cleaning of the film substrate S. This reduces the grains discharged from the film substrate S and included in the sputtering grains Sp discharged from the target 21.

(6) When the film substrate S is reversely sputtered, the voltage of which a frequency is higher than or equal to 1 MHz and lower than or equal to 6 MHz is applied to the film substrate S. According to this configuration, the speed of reversely sputtering the film substrate S can be increased. Further, the in-plane distribution of the reverse sputtering speed of the film substrate S is also increased.

(7) If the film substrate S is reversely sputtered, the speed of reversely sputtering the film substrate S is also increased when the voltage having a frequency higher than or equal to 13 MHz and lower than or equal to 28 MHz and a voltage having a frequency higher than or equal to 100 kHz and lower than or equal to 1 MHz are superimposed on the film substrate S. Further, the in-plane distribution of the reverse sputtering speed of the film substrate S is also increased.

Second Embodiment

Hereinafter, a thin substrate processing device according to a second embodiment will be described. The second embodiment differs from the first embodiment in that the electrostatic chuck 31 serving as the cooling unit in the first embodiment is changed to a gas cooling unit 101.

Hereinafter, the second embodiment will be described, focusing on differences from the first embodiment and omitting a detailed description of components similar to those of the first embodiment and denoted with the same reference characters.

As shown in FIG. 1, the gas cooling unit 101 is used in place of the electrostatic chuck 31 that is located in the sputtering device 10 of the first embodiment, for example. The gas cooling unit 101 is located in each of the first and second film formation chambers 12B and 12C. The gas cooling unit 101, which includes a first surface that faces the film substrate S (and the target 21) and a second surface at the opposite side, cools the film substrate S by supplying a cooling gas from the first surface of the gas cooling unit 101 toward the film substrate S. In the same manner as the electrostatic chuck 31 in the first embodiment, the gas cooling unit 101 is coupled to the position changing unit 32 that changes the position of the gas cooling unit 101 in the load-unload direction (white arrow direction in FIG. 1).

By moving the gas cooling unit 101 in the load-unload direction, the position changing unit 32 changes the position of the gas cooling unit 101 between the contact position at which the gas cooling unit 101 contacts the tray T and the non-contact position at which the gas cooling unit 101 does not contact the tray T.

The gas cooling unit 101 is moved to the contact position when the film substrate S is loaded into the film formation chamber 12B or 12C and has been placed at the processing position, and is moved to the non-contact position when the film substrate S is unloaded from the film formation chamber 12B or 12C. That is, when the film substrate S is loaded into the film formation chamber and unloaded from the film formation chamber, the gas cooling unit 101 is separated from the tray T. Therefore, the gas cooling unit 101 does not contact the film substrate S during the transportation of the film substrate S, and damaging of the film substrate S and the gas cooling unit 101 can be limited.

The configuration of the gas cooling unit 101 will now be described with reference to FIGS. 14 and 15.

Figure 14:
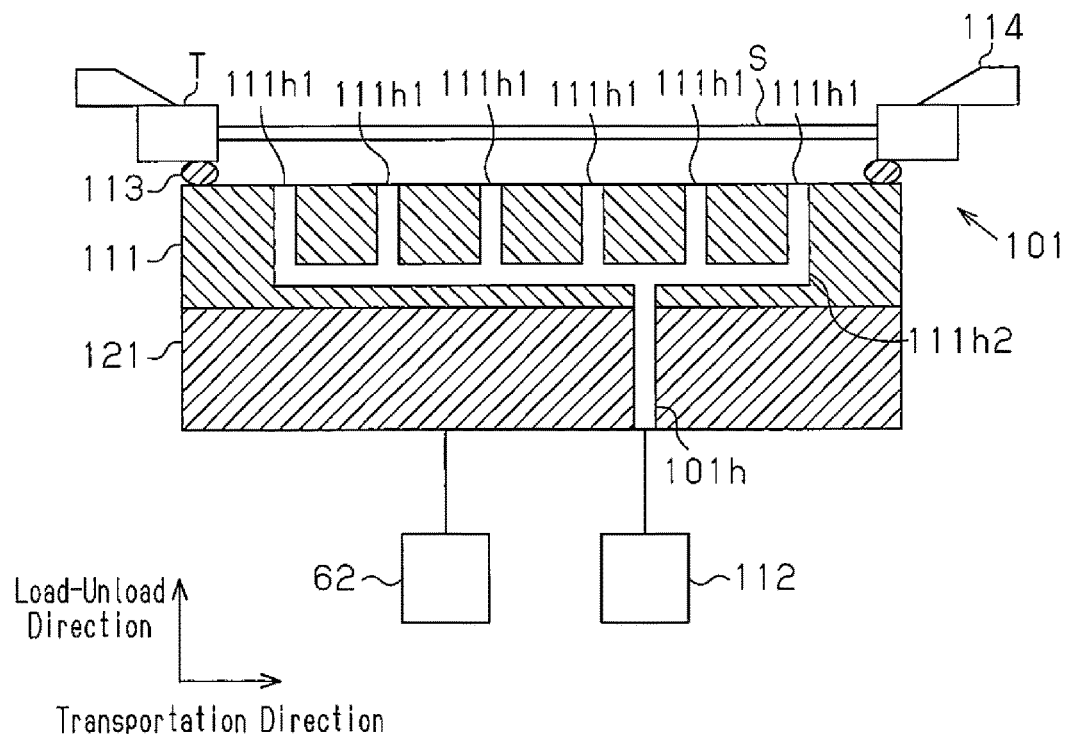
FIG. 14 is a cross-sectional view schematically showing the structure of a gas cooling unit as another example of the cooling unit.

As shown in FIG. 14, the gas cooling unit 101 includes a cooling plate 111. The material of the cooling plate 111 is a ceramic such as aluminum oxide or a resin such as polyimide. The width (horizontal direction in the plane of the drawing) of the cooling plate 111 is approximately equal to or smaller than the width of the film substrate S. The length (vertical direction in the plane of the drawing) of the cooling plate 111 is substantially equal to or larger than the length of the film substrate S. That is, the size of the cooling plate 111 is substantially equal to or larger than the size of the film substrate S.

The cooling plate 111 includes a plurality of cooling holes 111h1, which are arranged at predetermined intervals in the surface of the cooling plate 111, and one cooling passage 111h2 connected to each cooling hole 111h1. The cooling holes 111h1 and the cooling passages 111h2 are, for example, tubular and serve as cooling gas passages through which the cooling gas flows.

The cooling plate 111 has a first surface that faces the film substrate S and a second surface at the opposite side. A plate-like bias electrode 121 is attached to the second surface of the cooling plate 111. A cooling gas supply hole 101h that extends through the bias electrode 121 and is connected to the cooling passage 111h2 is formed in the bias electrode 121 and the cooling plate 111.

A cooling gas having a predetermined temperature is supplied from the cooling gas supply source 112 to the cooling gas supply hole 101h. A helium gas or an argon gas, for example, is used as the cooling gas.

A bias high-frequency power supply 62 that supplies high-frequency electric power is connected to the bias electrode 121. In the second embodiment, the bias electrode 121, the bias high-frequency power supply 62, and the sputtering gas supply unit 25 (see FIG. 1) configure the reverse sputtering unit. Further, the bias high-frequency power supply 62 configures a voltage application unit.

A ring-shaped sealing member 113 is attached to a first surface of the cooling plate 111 that faces the film substrate S. The sealing member 113 is located along the outer peripheral edge of the cooling plate 111. When the film substrate S is located at the processing position and when the gas cooling unit 101 is located at the contact position, the sealing member 113 is squeezed by the tray T and the gas cooling unit 101.

This forms a cooling void that is closed by the cooling plate 111, the tray T, the film substrate S, and the sealing member 113. The cooling gas supply source 112 continuously supplies the cooling gas to the cooling void at a predetermined flow rate when the cooling void is formed. When the cooling gas is supplied to the cooling void, the entire surface of the film substrate S that faces the cooling plate 111 is in contact with the cooling gas.

The gas cooling unit 101 further includes a clamp 104 that pushes the tray T toward the gas cooling unit 101 (the sealing member 113).

In the second embodiment, the gas cooling unit 101 cools the film substrate S with the cooling gas. Therefore, even when grains having high energy reach the film substrate S when forming a film on the film substrate S, for example, rises in the temperature of the film substrate S are limited.

If high-frequency electric power is supplied from the bias high-frequency power supply 62 to the bias electrode 121 when the argon gas is being supplied from the sputtering gas supply unit 25 to the first film formation chamber 12B, plasma is generated in the first film formation chamber 12B from the argon gas. If high-frequency electric power is supplied to the bias electrode 121 when the gas cooling unit 101 is in contact with the tray T through the sealing member 113, a bias voltage is applied to the film substrate S. Accordingly, positive ions in the plasma are drawn to the film substrate S, and the surface of the film substrate S that does not face the gas cooling unit 101 is reversely sputtered.

Figure 15:
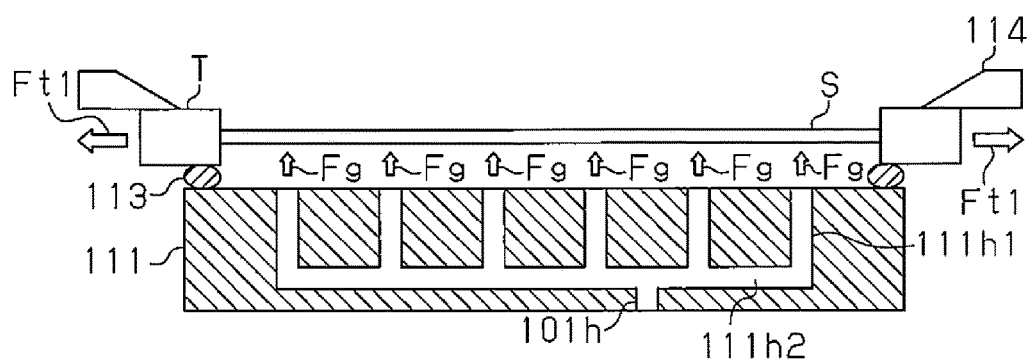
FIG. 15 is a view schematically showing force that acts on the film substrate by a cooling gas.

As shown in FIG. 15, the film substrate S is being pulled by the tray T by tensile force Ft1 from the center of the film substrate S toward the circumference. The tensile force Ft1 is set to a value sufficiently larger than a maximum value Fg of the pressure of the cooling gas that is supplied to the cooling void. Therefore, even when the cooling gas is continuously supplied to the cooling void during a period when the cooling void is being formed, bending of the film substrate S in a bulged manner toward the target 21 is limited. Therefore, the shape of the film substrate S is sustained during the period when the film formation processing is being performed on the film substrate S, and variations in the thickness of the thin film in the surface of the film substrate S are limited.

Next, the electrical configuration of the sputtering device 10 according to the second embodiment will now be described with reference to FIG. 16 focusing on differences from the first embodiment.

Figure 16:
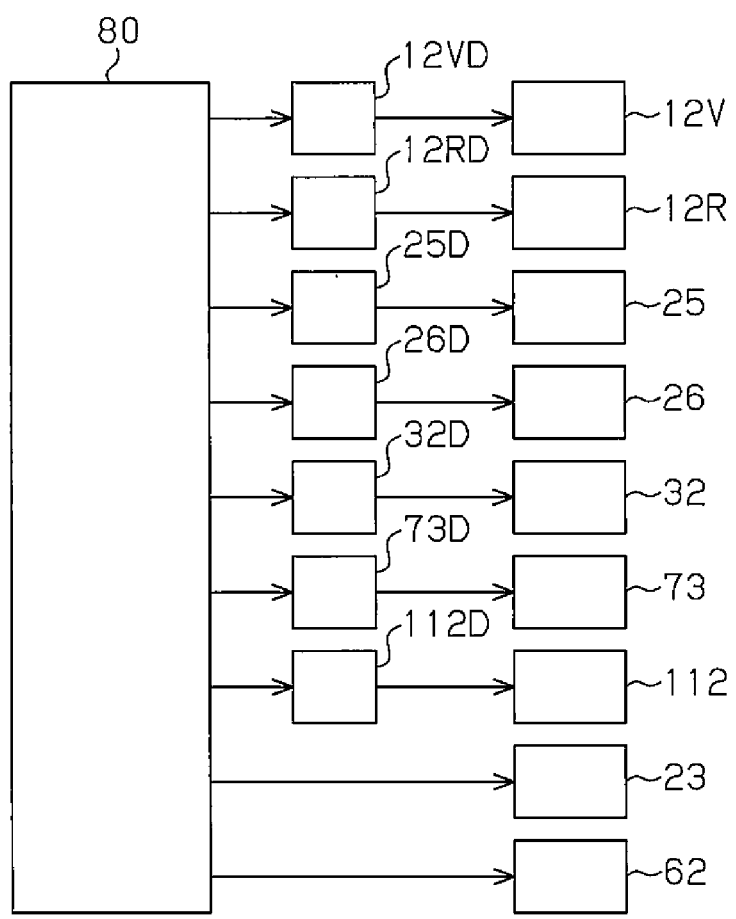
FIG. 16 is a block diagram showing an electrical configuration of a sputtering device according to a second embodiment.

As shown in FIG. 16, in the second embodiment, in place of the chuck power supply 43 (see FIG. 5), the cooling gas supply source 112 is connected to the controller 80 via a cooling gas supply source driving circuit 112D.

The controller 80 provides the cooling gas supply source driving circuit 112D with a supply starting signal for starting the supply of the cooling gas from the cooling gas supply source 112, and a supply stopping signal for stopping the supply of the cooling gas from the cooling gas supply source 112. The cooling gas supply source driving circuit 112D drives the cooling gas supply source 112 in response to the supply starting signal, and stops driving the cooling gas supply source 112 in response to the supply stopping signal.

The operation of the sputtering device 10 in the second embodiment will now be described with reference to FIGS. 6 to 9.

In the same manner as the first embodiment, in the sputtering device 10 of the second embodiment, the reverse sputtering, the adhesion layer formation processing, and the seed layer formation processing are performed sequentially. Hereinafter, the operation of the sputtering device 10 in the second embodiment will be described in the order of the reverse sputtering, the adhesion layer formation processing, and the seed layer formation processing.

As shown in FIG. 6, when performing the film formation processing to the film substrate S, the controller 80 first generates a drive starting signal for the substrate rotating unit 12R (the rotary motor). In response to the drive starting signal, the substrate rotating unit 12R rotates the film substrate S which is mounted on the mounting section counterclockwise by 90 degrees. This arranges the tray T on the transportation lane 12L of the first film formation chamber 12B. Before the film substrate S is loaded into the vacuum chamber 12, the controller 80 generates a drive starting signal for driving the exhaust unit 12V, and the exhaust unit 12V discharges gas out of the vacuum chamber 12. Accordingly, the inside of the vacuum chamber 12 is decompressed to a predetermined pressure level. The cover of the shutter 26 is located at the closing position and closes the opening 26a.

After the film substrate S is loaded into the first film formation chamber 12B, the controller 80 generates a supply starting signal for driving the two sputtering gas supply units 25. In response to the supply starting signal, each sputtering gas supply unit 25 starts supplying the argon gas to the inside of the vacuum chamber 12 at a predetermine flow rate and holds the vacuum chamber 12 at a predetermined pressure. The two sputtering gas supply units 25 may supply argon gas at the same flow rate or at different flow rates.

Then, the controller 80 generates a drive starting signal for driving the transportation motor 73. When the transportation motor 73 has been driven in response to the drive starting signal, the film substrate S is transported from the non-processing position to the processing position opposite to the target 21 of the first film formation unit 20A along the transportation lane 12L. Thereafter, when the film substrate S reaches the processing position, the controller 80 generates a drive stopping signal for stopping the driving of the transportation motor 73. As a result, the transportation of the film substrate S stops. At this time, the film substrate S is fixed with the upper edge of the tray T fixed in the holding groove 74h of the substrate fixing unit 74.

As shown in FIG. 7, the controller 80 then generates a drive starting signal for driving the position changing unit 32 (the position changing motor). In response to the drive starting signal, the position changing unit 32 of the first film formation unit 20A moves the gas cooling unit 101 from the non-contact position to the contact position. At this time, the tray T is fixed by the substrate fixing unit 74. Thus, variations in the position of the film substrate S can be limited even when the gas cooling unit 101 contacts the tray T. After the gas cooling unit 101 moves to the contact position, the cooling void is formed.

Next, the controller 80 generates a supply starting signal for driving the cooling gas supply source 112. In response to the supply starting signal, the cooling gas supply source 112 cools the film substrate S by starting the supply of the cooling gas to the cooling void. Next, the controller 80 generates a supply starting signal for driving the bias high-frequency power supply 62 of the first film formation unit 20A. In response to the supply starting signal, the bias high-frequency power supply 62 starts supplying high-frequency electric power to the bias electrode 121.

Accordingly, plasma is generated in the first film formation chamber 12B from the argon gas, and positive ions in the plasma are drawn toward the film substrate S. As a result, the surface of the film substrate S that faces the target 21 is reversely sputtered, and foreign matter or the like are removed from the film substrate S. That is, the surface (the film formation surface) of the film substrate S is cleaned by the reverse sputtering. The film substrate S is cooled by the gas cooling unit 101, and rises in the temperature of the film substrate S are limited. Further, the first surface of the target 21 that faces the film substrate S is covered by the shutter 26. Thus, grains discharged from the film substrate S subtly adhere to the surface of the target 21.

As described above, even when the surface cleaning processing resulting from the reverse sputtering of the film substrate S and the film formation processing to the film substrate S are performed in the same first film formation chamber 12B, the thin film that is formed on the film substrate S contains subtle grains that have been discharged from the film substrate S. Further, the cleaning processing of the surface of the target 21 that faces the film substrate S can be omitted before performing the film formation of the film substrate S. Thus, the number of film formation processing processes that are performed in the vacuum chamber 12 can be reduced.

After the reverse sputtering of the film substrate S has been performed over a predetermined period of time, the controller 80 generates a supply stopping signal for stopping the driving of the bias high-frequency power supply 62. In response to the supply stopping signal, the bias high-frequency power supply 62 stops supplying the high-frequency electric power to the bias electrode 121. Accordingly, the reverse sputtering of the film substrate S is completed.

As shown in FIG. 8, the controller 80 then generates a drive starting signal for driving the shutter 26 (the shutter motor). In response to the drive starting signal, the shutter 26 moves the cover to the opening position of opening the opening 26a. Next, the controller 80 generates a supply starting signal for driving the target power supply 23. In response to the supply starting signal, the target power supply 23 supplies electric power to the target 21 through the backing plate 22. Accordingly, plasma is generated in the first film formation chamber 12B from the argon gas, and the first surface of the target 21 that faces the film substrate S is sputtered by the positive ion in the plasma. In this way, a thin film of titanium is formed on the film substrate S as an adhesion layer by discharging the sputtering grains Sp that contain titanium as a main component from the target 21 toward the film substrate S.

The argon gas is continuously supplied to the first film formation chamber 12B during both processes of the reverse sputtering of the film substrate S and the formation of the adhesion layer. Therefore, the pressure in the first film formation chamber 12B subtly changes. Consequently, as compared with when stopping the supply of the argon gas simultaneously with when completing the reverse sputtering of the film substrate S, plasma can be efficiently generated in the first film formation chamber 12B from the argon gas when starting the formation of the adhesion layer. The film substrate S is continuously cooled by the gas cooling unit 101 during both processes of the reverse sputtering of the film substrate S and the formation of the adhesion layer. Therefore, the period of cooling the film substrate S becomes longer than when stopping the cooling of the film substrate S by the gas cooling unit 101 simultaneously with when completing of the reverse sputtering of the film substrate S. As a result, rises in the temperature of the film substrate S can be effectively limited.

After the formation of the adhesion layer over a predetermined period of time, the controller 80 generates a supply stopping signal for stopping the driving of the target power supply 23. In response to the supply stopping signal, the target power supply 23 completes the formation of the adhesion layer on the film substrate S by stopping the supply of electric power to the backing plate 22 (the target 21). Thereafter, the controller 80 generates a supply stopping signal for stopping the driving of the cooling gas supply source 112, and the cooling gas supply source 112 stops supplying the cooling gas to the cooling void in response to the supply stopping signal. The controller 80 generates a drive starting signal for driving the shutter 26 (the shutter motor). In response to the drive starting signal, the shutter 26 moves the cover to the closing position to close the opening 26a.

As shown in FIG. 9, the controller 80 then generates a drive starting signal for driving the position changing unit 32 (the position changing motor). In response to the drive starting signal, the position changing unit 32 of the first film formation unit 20A moves the gas cooling unit 101 from the contact position to the non-contact position. Next, the controller 80 generates a drive starting signal for driving the transportation motor 73. When the transportation motor 73 has been driven in response to the drive starting signal, the upper edge of the tray T moves out of the holding groove 74h of the substrate fixing unit 74, and the film substrate S is transported toward the substrate rotating unit 12R along the transportation lane 12L.

When the film substrate S is moved to the substrate rotating unit 12R, the substrate rotating unit 12R transports the film substrate S to the transportation lane 12L of the second film formation unit 20B, without rotating the film substrate S. Next, the controller 80 generates a drive starting signal for driving the transportation motor 73 of the second film formation chamber 12C. As a result, the film substrate S is transported from the non-processing position toward the processing position of the second film formation unit 20B along the transportation lane 12L. When the film substrate S reaches the processing position, the controller 80 generates a drive stopping signal for stopping the driving of the transportation motor 73. Accordingly, the transportation of the film substrate S stops. This fixes the film substrate S by holding the upper edge of the tray T in the holding groove 74h of the substrate fixing unit 74.

Next, the controller 80 generates a drive starting signal for driving the position changing unit 32 (the position changing motor). In response to the drive starting signal, the position changing unit 32 of the second film formation unit 20B moves the gas cooling unit 101 from the non-contact position to the contact position. At this time, the tray T is fixed by the substrate fixing unit 74. Thus, variations in the position of the film substrate S can be limited even when the gas cooling unit 101 contacts the tray T. After the gas cooling unit 101 moves to the contact position, the cooling void is formed.

Then, the controller 80 generates a supply starting signal for driving the cooling gas supply source 112. In response to the supply starting signal, the cooling gas supply source 112 cools the film substrate S by starting the supply of the cooling gas to the cooling void.

Next, the controller 80 generates a supply starting signal for driving the target power supply 23 of the second film formation unit 20B. In response to the supply starting signal, the target power supply 23 supplies electric power to the target 21 through the backing plate 22. Accordingly, plasma is generated in the second film formation chamber 12C from the argon gas, and the first surface of the target 21 that faces the film substrate S is sputtered by the positive ion in the plasma. As a result, the sputtering grains Sp that contain copper as a main component are discharged from the target 21 toward the film substrate S, and a thin film of copper serving as a seed layer is formed on the film substrate S. The film substrate S is cooled by the gas cooling unit 101, and rises in the temperature of the film substrate S are limited.

After the formation of the seed layer over a predetermined period of time, the controller 80 generates a supply stopping signal for stopping the driving of the target power supply 23. In response to the supply stopping signal, the target power supply 23 completes the formation of the seed layer by stopping the supply of electric power to the backing plate 22 (the target 21). Next, the controller 80 generates a supply stopping signal for stopping the driving of the cooling gas supply source 112, and the cooling gas supply source 112 stops supplying the cooling gas to the cooling void in response to the supply stopping signal. Thereafter, the controller 80 generates a drive starting signal for driving the position changing unit 32 (the position changing motor), and the position changing unit 32 moves the gas cooling unit 101 from the contact position to the non-contact position, in response to the drive starting signal. Accordingly, the gas cooling unit 101 is separated from the tray T, and the cooling gas that has been supplied into the cooling void is discharged into the second film formation chamber 12C.

Next, the controller 80 generates a supply stopping signal for stopping the driving of each of the two sputtering gas supply units 25, and each sputtering gas supply unit 25 stops supplying the argon gas to the vacuum chamber 12 in response to the supply stopping signal.

In this manner, the argon gas is continuously supplied into the vacuum chamber 12 from the start of the reverse sputtering of the film substrate S to the end of the formation of the adhesion layer and the seed layer. Therefore, during a series of the processes of the reverse sputtering, the formation processing of the adhesion layer, and the formation processing of the seed layer, the pressure in the vacuum chamber 12 subtly changes. Therefore, when forming the adhesion layer and the seed layer, plasma can be efficiently generated in the vacuum chamber 12.

In the same manner as the first embodiment, in the second embodiment, the reverse sputtering, the adhesion layer formation processing, and the seed layer formation processing can also be performed on both surfaces of the film substrate S.

In this case, in the second embodiment, the cooling plate 111 of the gas cooling unit 101 does not contact the film substrate S. Therefore, the cooling plate 111 does not contact the film formed on each surface (or both surfaces) of the film substrate S. Consequently, damaging and delamination of films and layers formed on the film substrate S are limited as compared with a configuration in which the film substrate S is cooled while in contact with the film substrate S.

The reverse sputtering speed was measured in the same manner as Example 2 and Example 3 of the first embodiment using the sputtering device 10 of the second embodiment described above. Measurement results similar to that of FIG. 11 (Example 2) and FIG. 12 (Example 3) were also obtained in the second embodiment.

The thin substrate processing device of the second embodiment has the following advantages.

(8) The gas cooling unit 31 cools the film substrate S when sputtering grain Sp having high energy are discharged. Therefore, rises in the temperature of the film substrate S are limited as compared with when cooling is not performed.

(9) By supplying the cooling gas to the cooling void, the entire surface of the film substrate S that does not face the target 21 is cooled by the cooling gas. Therefore, rises in the temperature of the film substrate S are limited as compared with when part of the surface of the film substrate S that does not face the target 21 is cooled.

(10) Rises in the temperature of the film substrate S are limited by the cooling gas that is supplied to the cooling void. This limits deformation of the film substrate S. Therefore, variations in the quantity of the sputtering grains Sp that reach the surface of the film substrate S can be limited. That is, variations in the thickness of the thin film that is formed in the film substrate S are limited in the surface of the film substrate S.

(11) The surface of the film substrate S on which the thin film is formed is cooled by the cooling gas. Thus, damaging and delamination of the film from the film substrate S are limited as compared with when the film substrate S is cooled through contact with the film substrate S.

(12) The reverse sputtering (cleaning processing) of the film substrate S is performed when the surface of the target 21 is covered by the shutter 26. Therefore, even when the bias electrode 121 used for the cleaning of the film substrate S is set together with the target 21 in the same first film formation chamber 12B, the grains discharged from the film substrate S and adhered to the surface of the target 21 are reduced by cleaning the film substrate S. This reduces the grains discharged from the film substrate S and from included in the sputtering grains Sp discharged from the target 21.

(13) A voltage higher than or equal to 1 MHz and lower than or equal to 6 MHz is applied to the film substrate S when the film substrate S is reversely sputtered. According to this configuration, the speed of reversely sputtering the film substrate S can be increased. Further, the in-plane distribution at the speed of reversely sputtering the film substrate S can be also increased.

(14) If the film substrate S is reversely sputtered, the speed of reversely sputtering the film substrate S is also increased when the voltage of which a frequency is higher than or equal to 13 MHz and lower than or equal to 28 MHz and a voltage of which a frequency is higher than or equal to 100 kHz and lower than or equal to 1 MHz are superimposed on the film substrate S. Further, the in-plane distribution at the speed when reversely sputtering the film substrate S can be also increased.

The above embodiments may be modified as described below.

The frequency of the high-frequency electric power supplied from the bias high-frequency power supply 62 is not limited to higher than or equal to 1 MHz and lower than or equal to 6 MHz. Other frequencies may be used when the surface of the film substrate S that faces the target 21 can be cleaned by reversely sputtering the surface of the film substrate S.

When the frequency of the high-frequency electric power that is supplied from the bias high-frequency power supply 62 is higher than or equal to 13 MHz and lower than or equal to 28 MHz, the high-frequency electric power of a frequency higher than or equal to 100 kHz and equal to lower than 1 MHz does not have to be superimposed. In this case, the film substrate S can be also cleaned because the surface of the film substrate S that faces the target 21 is reversely sputtered.

The shutter 26 does not have to be coupled to the first film formation chamber 12B. In such a configuration, a reverse sputtering chamber for cleaning the film substrate S may be separated from a processing chamber for forming the thin film on the film substrate S. In this case, the bias electrode 61 (or 121) and the bias high-frequency power supply 62 both do not have to be included in the first film formation chamber 12B. The reverse sputtering chamber only needs to include an electrostatic chuck similar to that of the first embodiment (or a gas cooling unit similar to that of the second embodiment), a position changing unit, a bias electrode, and a bias high-frequency power supply. Further, a grounding electrode serving as an anode may be set opposing the bias electrode. In this configuration, it is also possible to reduce the grains that are discharged from the film substrate S and adhered to the surface of the target 21. However, the reverse sputtering chamber for performing the cleaning of the film substrate S is separately provided. Thus, the area occupied by the sputtering device 10 is large.

When a reverse sputtering chamber separate from the first film formation chamber 12B is provided as described above, the film formation unit (the substrate processing unit) may have the following configuration.

Figure 17:
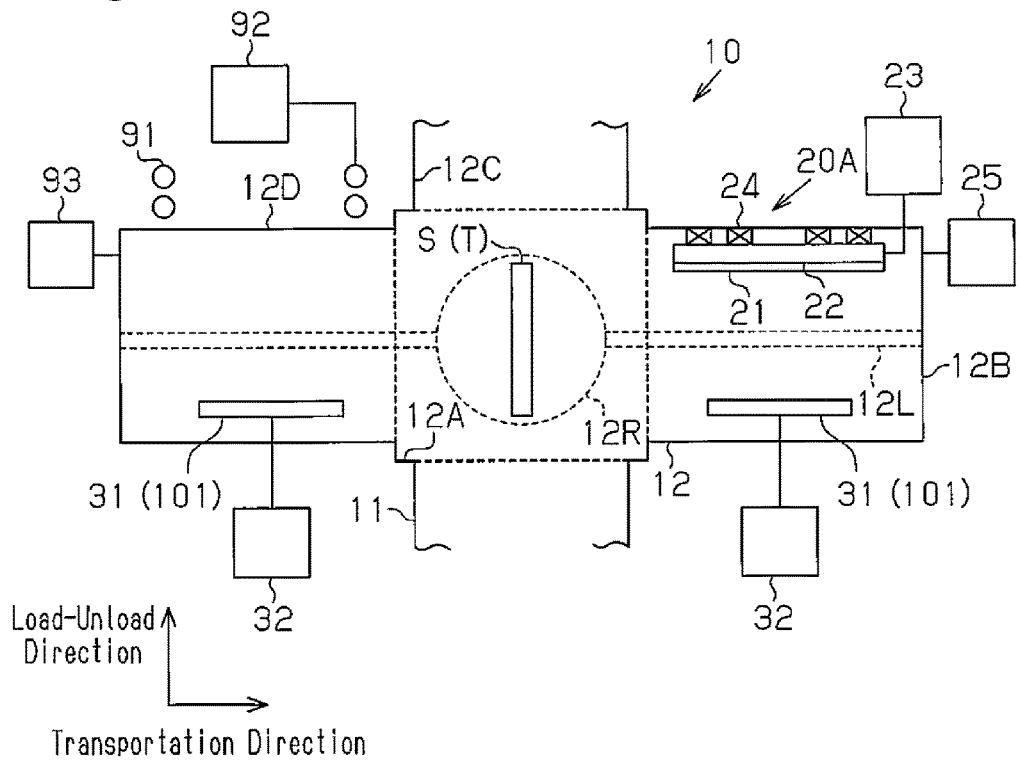
FIG. 17 is a plan view showing a schematic configuration of a sputtering device according to a modification, and also shows a film substrate that is accommodated in the sputtering device.

As shown in FIG. 17, the vacuum chamber 12 includes an etching chamber 12D in addition to the inverting chamber 12A, the first film formation chamber 12B, and the second film formation chamber 12C. The inverting chamber 12A is located between the etching chamber 12D and the first film formation chamber 12B in the transportation direction, and is also located between the load-unload chamber 11 and the second film formation chamber 12C in the load-unload direction. Although not shown in the drawings, in this case, the exhaust unit 12V for discharging gas from the vacuum chamber 12 is also included in the inverting chamber 12A. A high frequency antenna 91, which is one example of an induction coil, is located outside the etching chamber 12D.

An antenna high-frequency power supply 92 for supplying the high frequency antenna 91 with high-frequency electric power having a frequency of 13.56 MHz, for example, is connected to the high frequency antenna 91.

In such a configuration, if high-frequency electric power is supplied from the antenna high-frequency power supply 92 to the high frequency antenna 91 when argon gas, for example, is being supplied from the etching gas supply unit 93 to the etching chamber 12D, plasma is generated in the etching chamber 12D. In this state, when high-frequency electric power is supplied from the bias high-frequency power supply 62 to the bias electrode 61 (or 121), positive ions in the plasma are drawn toward the film substrate S. Accordingly, the surface of the film substrate S that faces the target 21 is etched. Also in this configuration, when the film substrate S is etched, rises in the temperature of the film substrate S are limited since the film substrate S is cooled by the electrostatic chuck 31 (or the gas supply unit 101).

The gas supplied from the etching gas supply unit 93 is not limited to argon gas, and may be a nitrogen gas, an oxygen gas, a carbon tetrafluoride gas, a sulfur hexafluoride gas, or nitrogen trifluoride gas. In the example of FIG. 17, the high frequency antenna 91, the antenna high-frequency power supply 92, the etching gas supply unit 93, the bias electrode 61 (or 121), and the bias high-frequency power supply 62 configure the etching unit.

Figure 18:
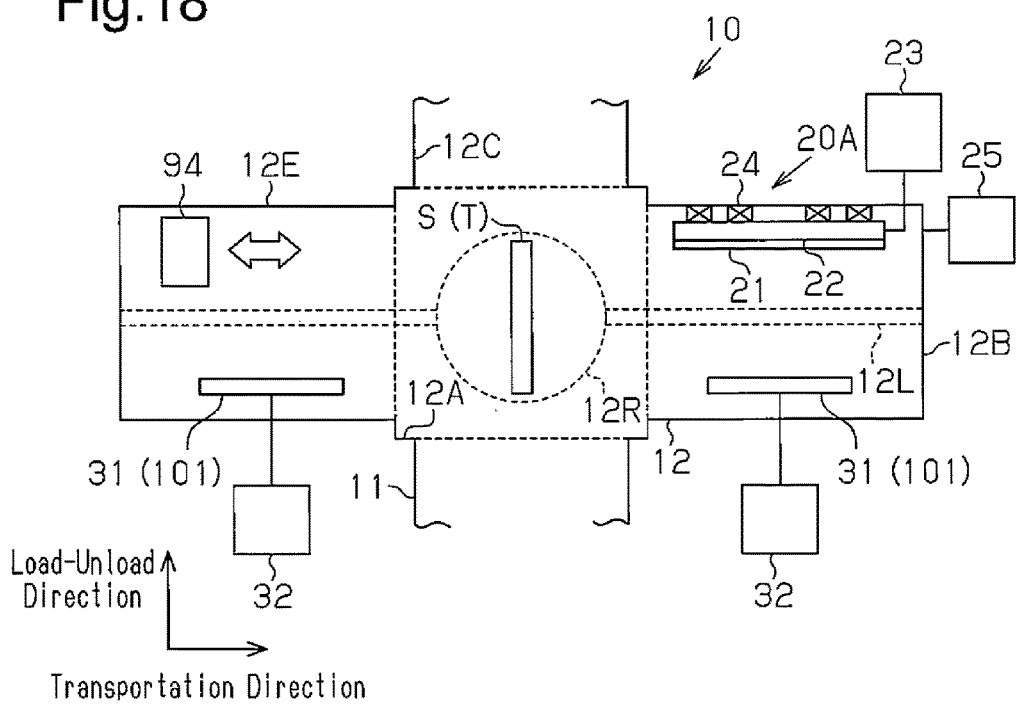
FIG. 18 is a plan view showing a schematic configuration of a sputtering device according to another modification, and also shows a film substrate that is accommodated in the sputtering device.

Alternatively, as shown in FIG. 18, the vacuum chamber 12 may include an ion processing chamber 12E in place of the etching chamber 12D. In this case, an ion gun 94 serving as the ion processing unit is located in the ion processing chamber 12E. A position changing unit that moves the ion gun 94 in the transportation direction is coupled to the ion gun 94. The position changing unit moves the ion gun 94 to the transportation direction from one end to the other end of the film substrate S at the processing position. Accordingly, the ion beam is irradiated to the entire surface of the film substrate S.

In such a configuration, the film substrate S can also be cleaned by, for example, the ion bombardment of irradiating the ion beam generated from the argon gas to the surface of the film substrate S that faces the ion gun 94. Also in this configuration, when the ion bombardment is performed on the film substrate S, rises in the temperature of the film substrate S are limited since the film substrate S is cooled by the electrostatic chuck 31 (or the gas supply unit 101). The gas that is used to generate the ion beam is not limited to the argon gas, and may be a nitrogen gas, an oxygen gas, a hydrogen gas, or the like.

In the ion processing chamber 12E, instead of setting the electrostatic chuck 31 (or the gas cooling unit 101) and the position changing unit 32, the ion gun 94 may be located at both sides of the film substrate S in the load-unload direction. In this case, a plurality (two to eight, for example) of ion guns 94 are located at positions opposite to each surface of the film substrate S. Then, when the film substrate S is transported along the transportation lane 12L, the ion beam is irradiated from each ion gun 94 to the film substrate S. Consequently, ion bombardment is performed on each surface of the film substrate S.

As described above, when the reverse sputtering chamber is provided separately from the first film formation chamber 12B, as shown in FIGS. 17 and 18, the second film formation chamber 12C may be connected to the inverting chamber 12A at a position opposite to the load-unload chamber 11 in the load-unload direction.

The sputtering device 10 does not necessarily have to include a structure for cleaning the film substrate S, that is, the bias electrode 61 (or 121), the bias high-frequency power supply 62, the etching chamber 12D, and the ion processing chamber 12E.

The substrate fixing unit 74 does not have to support the upper edge corner of the tray T shown in FIG. 3 and may support the upper edge central portion of the tray T. In this case, the groove width of the holding groove 74h formed on the substrate fixing unit 74 is set so that the groove has the same width throughout the substrate fixing unit 74 in the transportation direction and so that the tray T can pass through the holding groove 74h. Such a configuration also obtains advantage (3).

The substrate fixing unit 74 does not have to support the upper edge corner or the upper edge central portion of the tray T and may support any position of the upper edge of the film substrate S. Such a configuration also obtains advantage (3).

The substrate fixing unit 74 is not required to be attached to the upper wall of the first film formation chamber 12B and the upper wall of the second film formation chamber 12C. In this case, preferably, the substrate fixing unit 74 has a mass that does not deform the tray T when the electrostatic chuck 31 (or the gas cooling unit 101) contacts the film substrate S and pushes the film substrate S toward the target 21. In any case, the lower edge of the tray T is supported by the transportation lane 12L. Thus, the position of the film substrate S subtly changes even without the substrate fixing unit 74.

The position changing unit 32 that changes the electrostatic chuck 31 (or the gas cooling unit 101) may be omitted. In this case, it is preferable that the position of the electrostatic chuck 31 (or the gas cooling unit 101) be fixed, and the position of the tray T to the electrostatic chuck 31 (or the gas cooling unit 101) be changed in the load-unload direction. Such a configuration also obtains advantages (1) and (8) as long as the film substrate S is cooled by the electrostatic chuck 31 (or the gas cooling unit 101).

The electrostatic chuck 31 may include a plurality of insulation plates 41, and one or a plurality of chuck electrodes may be located in each insulation plate 41. Such a configuration also obtains advantage (1) as long as the film substrate S is attracted by each insulation plate.

The electrostatic chuck 31 may be configured to include one positive electrode 42a and one negative electrode 42b.

The electrostatic chuck 31 does not have to be a bipolar electrostatic chuck that includes both of the positive electrode 42a and the negative electrode 42b and may be a unipolar electrostatic chuck that includes a positive electrode and a negative electrode. Such a configuration also obtains advantage (1) as long as the film substrate S is attracted by the electrostatic chuck.

The gas that is used for the reverse sputtering is not limited to the argon gas and may be one of a nitrogen gas, an oxygen gas, a hydrogen gas, a carbon tetrafluoride gas, a sulfur hexafluoride gas, and a nitrogen trifluoride gas. Alternatively, the gas may be a mixed gas obtained by mixing two or more of these gases.

When using a gas that contains fluorine for the reverse sputtering in the first film formation chamber 12B or the reverse sputtering chamber or for the etching in the etching chamber 12D, it is preferable that a gate valve be arranged between each processing chamber and the inverting chamber 12A and that an exhaust unit be installed in each processing chamber.

In the vacuum chamber 12, various processes may be performed on only one surface of the film substrate S. Such a configuration also obtains advantages (1) and (8).

A lattice-shaped beam, for example, may be arranged on the surface of the film substrate S that faces the target 21. In this configuration, the mask reduces deformation of the film substrate S to a shape bulged toward the target 21. In such a configuration, tensile force that acts on the film substrate S can be lowered or avoided.

The cooling void that is formed between the cooling plate 111 and the film substrate S does not have to be sealed and may be open. According to such a configuration, a configuration for contacting the tray T and the gas cooling unit 101 to each other or the sealing member 113 can be omitted. Further, without providing a cooling void (sealed void), for example, the gas cooling unit 101 may be used to simply supply the cooling gas to the surface of the film substrate S that faces the cooling plate 111. In such a configuration, the film substrate S is cooled by the cooling gas, and advantage (8) can be also obtained. Further, when using a cooling void as an open void or when not providing a cooling void (sealed void), a cooling gas is also supplied to the surface on which the thin film is formed by depositing the sputtering grains on the thin substrate. This improves the effect for cooling the substrate.

The gas cooling unit 101 may stop supplying the cooling gas from the cooling gas supply source 112 when the pressure of the cooling gas supplied in the cooling void reaches a predetermined pressure level. In this case, the pressure of the cooling gas may be set so that the film substrate S does not deform and bulge toward the target 21. According to such a configuration, the film substrate S can be cooled while limiting deformation of the film substrate S.

The gas cooling unit 101 may be configured to supply a cooling gas from the cooling gas supply source 112 to the cooling void at a predetermined flow rate and discharge the cooling gas from the cooling void at a predetermined flow rate so that the pressure of the cooling gas in the cooling void is held at a predetermined value. Such a configuration limits deformation so that the film substrate S does not bulge toward the target 21. Further, cooling gas is circulated in the gas cooling unit 101. Thus, the heat of the film substrate S is more easily released to the cooling gas than a configuration in which the supply of the cooling gas is stopped when the pressure of the cooling gas in the cooling void reaches a predetermined pressure. As a result, rises in the temperature of the film substrate S are be limited.

The position changing unit 32 that changes the position of the gas cooling unit 101 in the load-unload direction does not have to be coupled to the gas cooling unit 101, and the position of the gas cooling unit 31 in the load-unload direction may be fixed to the above contact position.

A mechanism that heats the film substrate S in order to remove the gas adsorbed in the film substrate S may be provided in the load-unload chamber 11. Alternatively, a processing chamber including a mechanism that heats the film substrate S may be provided between the load-unload chamber 11 and the inverting chamber 12A.

The vacuum chamber 12 may not have a configuration that includes two film formation chambers or a configuration that includes at least one film formation chamber. Alternatively, the film formation processing unit may be omitted from the vacuum chamber 12, and the vacuum chamber 12 may have a configuration that includes at least any one of the reverse sputtering unit, the etching unit, and the ion processing unit.

The argon gas that is supplied when the film substrate S is reversely sputtered, the argon gas that is supplied when the adhesion layer is formed by the first film formation unit 20A, and the argon gas when the seed layer is formed by the second film formation unit 20B may flow at different rates. In such a configuration, when the argon gas is continuously supplied to the first film formation chamber 12B, plasma can be generated more efficiently in the first film formation chamber 12B than when stopping the supply of the argon gas at the same time as when completing the reverse sputtering to the film substrate S.

The supply of the argon gas to the first film formation chamber 12B may be stopped simultaneously with when completing the reverse sputtering of the film substrate S, and the supply of the argon gas may be started when the formation of the adhesion layer by the first film formation unit 20A is started. Further, only when the formation of the seed layer is performed by the second film formation chamber 12C, the argon gas may be supplied from the sputtering gas supply unit 25 of the second film formation unit 20B to the vacuum chamber 12.

The invention claimed is:
1. A substrate processing device comprising:
a processing chamber;
a transporting unit arranged in the processing chamber; and
an inverting chamber connected to the processing chamber to allow the transporting unit to transport a substrate, wherein
the processing chamber includes:
a substrate processing unit configured to process the substrate;
a cooling unit configured to cool the substrate when the substrate processing unit is processing the substrate; and
a position changing unit configured to change a position of the cooling unit relative to the substrate located at a processing position at which the substrate is processed by the substrate processing unit,
the transporting unit is configured to transport the substrate between the processing position and a non-processing position, at which the substrate is not processed by the substrate processing unit, while supporting a lower end of the substrate in an upright state of the substrate,
the position changing unit is configured to change the position of the cooling unit between a contact position at which the cooling unit contacts the substrate and a non-contact position at which the cooling unit does not contact the substrate,
the transporting unit is configured to transport the substrate when the cooling unit is located at the non-contact position,
the inverting chamber includes a substrate rotating unit having a mounting section on which the substrate of the upright state is mounted, wherein the substrate rotating unit is configured to rotate the mounting section around an axis which is orthogonal to a bottom wall of the inverting chamber; and
the substrate processing device is configured to process one surface of the substrate in the processing chamber, turn the substrate by 180° in the inverting chamber after the one surface of the substrate is processed, and process the other surface of the substrate in the processing chamber.

2. The substrate processing device according to claim 1, comprising:
a first processing chamber and a second processing chamber, each being provided as the processing chamber, wherein
the inverting chamber is arranged between the first processing chamber and the second processing chamber in a transportation direction of the substrate,
the transporting unit includes a first transportation lane, which is set on a bottom wall of the first processing chamber and extends to the transportation direction, and a second transportation lane, which is set on a bottom wall of the second processing chamber and extends to the transportation direction, and the substrate rotating unit is set within the inverting chamber between the first transportation lane and the second transportation lane.

3. The substrate processing device according to claim 1, herein; the substrate processing unit includes at least one of:

a film formation processing unit configured to form a film on the substrate by sputtering a target;

a reverse sputtering unit configured to perform reverse sputtering on the substrate by applying a bias voltage to the substrate;

an ion processing unit configured to perform ion bombardment on the substrate; and an etching unit configured to perform an etching on the substrate by applying a bias voltage to the substrate while generating plasma with an induction coil.

4. The substrate processing device according to claim 3, wherein the substrate processing unit includes the film formation processing unit and the reverse sputtering unit that share a vacuum chamber, the target of the film formation processing unit is opposed to the substrate in the vacuum chamber, and the substrate processing device further comprises a shutter configured to cover a surface of the target when the reverse sputtering unit performs reverse sputtering on a surface of the substrate opposing the surface of the target.

5. The substrate processing device according to claim 3, wherein the reverse sputtering unit includes:

a voltage application unit configured to apply a bias voltage to the substrate; and a gas supply unit configured to supply a gas to the substrate, and the voltage application unit is configured to apply a bias voltage having a frequency that is higher than or equal to 1 MHz and lower than or equal to 6 MHz to the substrate supplied with the gas.

6. The substrate processing device according to claim 3, wherein the reverse sputtering unit includes:

a voltage application unit configured to apply a bias voltage to the substrate, and a gas supply unit configured to supply a gas to the substrate, the voltage application unit is configured to apply the bias voltage to the substrate so that a voltage having a frequency that is higher than or equal to 13 MHz and lower than or equal to 28 MHz and a voltage having a frequency that is higher than or equal to 100 kHz and lower than or equal to 1 MHz are superimposed to the substrate supplied with the gas.

7. The substrate processing device according to claim 1, wherein the cooling unit is an electrostatic chuck configured to electrically attract the substrate, and the electrostatic chuck is configured to cool the substrate by attracting a surface of the substrate opposite to a processed surface thereof that is processed by the substrate processing unit.

8. The substrate processing device according to claim 1, wherein the cooling unit is a gas cooling unit configured to supply a gas to the substrate, and the gas cooling unit is configured to cool the substrate by supplying the gas to a surface of the substrate opposite to a processed surface there of that is processed by the substrate processing unit.

9. The substrate processing device according to claim 8, further comprising:

a tray attached to a circumference of the substrate; and a sealing member attached to the gas cooling unit at a location opposing the tray, wherein the gas cooling unit is configured to supply the gas to a cooling void sealed by the sealing member.

10. The substrate processing device according to claim 9, wherein the tray is configured to pull the substrate from a center of the substrate toward a circumference of the substrate, and the gas cooling unit is configured to supply the gas when the substrate is pulled.

11. The substrate processing device according to claim 8, wherein the substrate processing unit includes a film formation processing unit configured to form a film on the substrate by sputtering a target, and the gas cooling unit is configured to supply the gas also to a surface on which the film is formed by depositing sputtering grains on the substrate.

* * * * *